United States Patent
Lai

(10) Patent No.: US 9,345,181 B2
(45) Date of Patent: May 17, 2016

(54) SHIELDING FILM AND METHOD OF MANUFACTURING SAME

(71) Applicant: T-Kingdom Co., LTD., Taoyuan County (TW)

(72) Inventor: Yu Hao Lai, Taoyuan County (TW)

(73) Assignee: T-KINGDOM CO., LTD., Taoyuan County (TW)

( * ) Notice: Subject to any disclaimer, the term of this patent is extended or adjusted under 35 U.S.C. 154(b) by 35 days.

(21) Appl. No.: 14/463,105

(22) Filed: Aug. 19, 2014

(65) Prior Publication Data

US 2016/0057898 A1 Feb. 25, 2016

(51) Int. Cl.
*H01L 23/58* (2006.01)
*H05K 9/00* (2006.01)
*H01L 23/60* (2006.01)

(52) U.S. Cl.
CPC ............ *H05K 9/0026* (2013.01); *H01L 23/585* (2013.01); *H01L 23/60* (2013.01); *H05K 9/0039* (2013.01); *H05K 9/0084* (2013.01); *H05K 9/0086* (2013.01); *H05K 9/0088* (2013.01)

(58) Field of Classification Search
CPC .................................................... H05K 9/0086
See application file for complete search history.

(56) References Cited

U.S. PATENT DOCUMENTS

| | | | | | |
|---|---|---|---|---|---|
| 4,970,354 A | * | 11/1990 | Iwasa | ............... | H05K 9/0039 174/257 |
| 5,112,648 A | * | 5/1992 | Okonogi | ............... | H05K 1/0218 174/255 |
| 5,177,324 A | * | 1/1993 | Carr | ............... | H05K 1/0218 174/250 |
| 2006/0194020 A1 | * | 8/2006 | Naito | ............... | H05K 9/0096 428/138 |
| 2008/0212304 A1 | * | 9/2008 | Masuda | ............... | H01Q 1/38 361/818 |
| 2010/0053035 A1 | * | 3/2010 | Lee | ............... | H05K 9/0096 345/60 |
| 2011/0122596 A1 | * | 5/2011 | Miyazaki | ............... | H05K 9/0096 361/818 |
| 2013/0256848 A1 | * | 10/2013 | Kawabata | ............... | H01L 23/60 257/659 |
| 2014/0098501 A1 | * | 4/2014 | Kawaguchi | ............... | H05K 1/0277 361/750 |
| 2014/0240159 A1 | * | 8/2014 | Lawrence | ............... | H01Q 15/0013 342/1 |
| 2014/0326484 A1 | * | 11/2014 | Tajima | ............... | H05K 1/0216 174/250 |
| 2015/0245544 A1 | * | 8/2015 | Baumler | ............... | H05K 9/00 174/360 |
| 2015/0334886 A1 | * | 11/2015 | Jang | ............... | C09J 7/02 428/201 |

* cited by examiner

*Primary Examiner* — Stephen W Smoot
(74) *Attorney, Agent, or Firm* — Rabin & Berdo, P.C.

(57) ABSTRACT

A shielding film includes an insulation layer, a conductive shielding layer and an adhesive layer; and is manufactured in a method including the steps of connecting a conductive shielding layer to a substrate material and forming a plurality of cavities on them; forming an insulation layer on the conductive shielding layer to fill up all the cavities; forming a carrier film on a top of the insulation layer; removing the substrate material from the conductive shielding layer, such that a plurality of downward protruded metal grounding electrodes are formed on a lower side of the conductive shielding layer corresponding to the cavities; and providing an adhesive layer on the lower side of the conductive shielding layer, such that the metal grounding electrodes are exposed from the adhesive layer to present a geometric pattern. The produced shielding film shows good grounding effect and bonding strength to ensure enhanced electromagnetic shielding effect.

18 Claims, 30 Drawing Sheets

Form a plurality of cavities on a substrate material through hot stamping

↓

Form a conductive shielding layer on a top of the substrate material and in the cavities

↓

Form an insulation layer on a top of the conductive shielding layer, such that the insulation layer fills up all the cavities

↓

Form a carrier film on a top of the insulation layer

↓

Remove the substrate material from the conductive shielding layer, such that a plurality of downward protruded metal grounding electrodes are formed on a lower side of the conductive shielding layer corresponding to the cavities

↓

Provide an adhesive layer on the lower side of the conductive shielding layer, such that the metal grounding electrodes are exposed from the adhesive layer to present a geometric pattern

FIG. 9

Form a conductive shielding layer, and form a plurality of downward protruded portions on the conductive shielding layer, so that the downward protruded portions respectively form a metal grounding electrode

Form an insulation layer on a top of the conductive shielding layer

Provide an adhesive layer on a lower side of the conductive shielding layer opposite to the insulation layer, while the metal grounding electrodes are exposed from the adhesive layer to present a geometric pattern

FIG. 22

SHIELDING FILM AND METHOD OF MANUFACTURING SAME

FIELD OF THE INVENTION

The present invention relates to a shielding film and a manufacturing method thereof, and more particularly, to a shielding film that is manufactured in a specific method to provide good grounding effect and enhanced electromagnetic shielding effect.

BACKGROUND OF THE INVENTION

In response to consumers' demands, the currently designed electronic and communication products all are small in volume, light in weight and powerful in function.

However, to meet the above requirements in design, the currently available electronic and communication products also have densely arranged high-frequency clock electric circuits. This condition inevitably worsens the electromagnetic radiation problem and results in electromagnetic interference (EMI) among different electronic products or even has bad influence on users' health.

In the past, engineers tried to solve the problem of electromagnetic radiation with specially designed and planned circuits. This solution, however, requires relatively long time and high cost to achieve the purpose of EMI prevention. To overcome the above disadvantage, a new way has been developed recently to use a shielding film on the electronic product to shield electromagnetic wave. Since the shielding film has the advantage of being convenient to use and low in cost, and it is not necessary to re-design the products for using with the shielding film, the shielding film has been quickly and widely adopted by the electronic industry for EMI prevention.

According to the principle of the shielding film, shielding layers having good electric conductivity are attached to upper and lower surfaces of electronic working elements in the electronic product and are electrically connected to the grounding circuit of the product. When the electromagnetic radiation reaches the shielding layer, an electromagnetic interaction occurs, and electromagnetic energy is absorbed by the grounding circuit, so that the shielding layer has the effect of shielding electromagnetic radiation.

The electric conduction between the shielding layer and the grounding circuit of the electronic working elements has direct influence on the electromagnetic shielding effect of the shielding layer. When the grounding circuit has a relatively small contact resistance while the electromagnetic interaction is relatively strong, better shielding effect can be obtained.

FIG. 1 shows the structure of a conventional shielding film 1 includes an insulation layer 11, a shielding layer 12 and a conductive adhesive layer 13. The insulation layer 11 stops the conductive shielding layer 12 from contacting with electronic elements. The conductive adhesive layer 13 includes an adhesive agent having conductive particles 13a added thereto. The conductive particles 13a electrically connect the shielding layer 12 to the grounding circuit of the electronic elements, and the conductive adhesive layer 13 is heat cured. With these arrangements, the shielding film 1 can be fixedly attached to electronic elements to achieve the purpose of shielding electromagnetic wave.

However, in the conventional shielding film 1 shown in FIG. 1, while the conductive adhesive layer 13 having the conductive particles 13a added thereto can provide bonding and electrical conducting functions at the same time, the large contact resistance among the conductive particles 13a tends to result in lowered electric conduction and accordingly indirectly affects the intended shielding effect. Further, the size uniformity, the degree of dispersion and the settling of the conductive particles 13a all have influence on the electric conduction and the adhesion of the shielding film 1 to thereby lower the shielding effect thereof.

In view of the disadvantages in the conventional shielding film, it is desirable to develop an improved shielding film having excellent electromagnetic shielding function and a method for efficiently manufacturing such shielding film through simplified procedures at reduced cost.

SUMMARY OF THE INVENTION

A primary object of the present invention is to provide a shielding film that includes an adhesive layer to fill up a relatively large area of spaces formed among a plurality of metal grounding electrodes below a conductive shielding layer. Since no conductive particles are added to the adhesive layer, the problem of low electrical conduction due to high contact resistance among the conductive particles is avoided, and the shielding film can provide good grounding effect.

Another object of the present invention is to provide a shielding film, an adhesive layer of which has good bonding strength because no conductive particles are added thereto to adversely affect the adhesion of the adhesive layer.

A further object of the present invention is to provide a method of manufacturing shielding film, so that the shielding film manufactured in the method has high electric conduction property and good bonding strength to provide good shielding effect. Further, the shielding film manufacturing method of the present invention has simplified procedures to enable reduced manufacturing cost and increased industrial applicability.

To achieve the above and other objects, the shielding film according to the present invention includes:

an insulation layer; at least one conductive shielding layer located on a lower side of the insulation layer; and an adhesive layer located on a lower side of the conductive shielding layer. A part area of the conductive shielding layer is downward protruded to form a plurality of metal grounding electrodes, which are distributed over the lower side of the conductive shielding layer and together present a geometric pattern to define a plurality of relatively large filling spaces among them. The adhesive layer fills up the filling spaces.

The insulation layer can be a simple structure formed of a first insulation material, or a composite structure formed of a first insulation material and a bonding material.

In a first embodiment of the present invention, the conductive shielding layer includes at least one metal shielding material located below and connected to the insulation layer, and the metal grounding electrodes are provided on a lower side of the metal shielding material.

In a second embodiment of the present invention, the conductive shielding layer includes at least one metal shielding material located below and connected to the insulation layer, and the metal shielding material is partially downward protruded to form the metal grounding electrodes.

In a third embodiment of the present invention, the insulation layer includes a plurality of first protruded portions formed on a lower side thereof, and the conductive shielding layer includes at least one metal shielding material located below and connected to the insulation layer; and portions of the metal shielding layer corresponding to the first protruded portions of the insulation layer form the metal grounding electrodes.

In an operable embodiment, the conductive shielding layer further includes a weatherproof layer.

In a preferred embodiment, the conductive shielding layer further includes at least one second insulation material, which is located between and connected to two adjacent layers of the metal shielding material.

According to the present invention, the bonding material can be nickel (Ni), tin (Sn), zinc (Zn), silver (Ag), copper (Cu), aluminum (Al), titanium (Ti), chromium (Cr), molybdenum (Mo), tungsten (W), iron (Fe), vanadium (V), cobalt (Co), niobium (Nb), a polymeric material, any combination of the aforesaid materials, or any oxide of the aforesaid materials.

According to the present invention, the metal shielding material has a thickness ranged between 0.1 μm and 15 μm; and the metal shielding material can be copper (Cu), silver (Ag), aluminum (Al), nickel (Ni), zinc (Zn), tin (Sn), iron (Fe), carbon (C), graphite, graphene, an electrically conductive polymeric material, or any combination thereof.

According to the present invention, the metal grounding electrodes have a height ranged between 3 μm and 30 μm; and the metal grounding electrodes can be formed of copper (Cu), silver (Ag), aluminum (Al), nickel (Ni), zinc (Zn), tin (Sn), iron (Fe), carbon (C), graphite, graphene, or any combination thereof.

In a fourth embodiment of the present invention, the shielding film includes an insulation layer containing particles of at least one type of electrically insulating, heat conductive material; a conductive shielding layer located below the insulation layer and having a part area downward protruded to form a plurality of metal grounding electrodes, which together present a geometric pattern to define a plurality of relatively large filling spaces among the metal grounding electrodes; and an adhesive layer filled in the filling spaces and containing metal particles.

In a fifth embodiment of the present invention, the shielding film includes a conductive shielding layer, a part area of which is downward protruded to form a plurality of metal grounding electrodes, which together present a geometric pattern to define a plurality of relatively large filling spaces among the metal grounding electrodes; and an adhesive layer filled in the filling spaces.

To achieve the above and other objects, a preferred embodiment of the method of manufacturing shielding film according to the present invention include the steps of (A) connecting a conductive shielding layer to a top of a substrate material, and forming a plurality of cavities on the substrate material and the conductive shielding layer; (B) forming an insulation layer on a top of the conductive shielding layer, such that the insulation layer fills up all the cavities; (C) forming a carrier film on a top of the insulation layer; (D) removing the substrate material from the conductive shielding layer, such that a plurality of downward protruded metal grounding electrodes are formed on a lower side of the conductive shielding layer corresponding to the cavities; and (E) providing an adhesive layer on the lower side of the conductive shielding layer, such that the metal grounding electrodes distributed over the lower side of the conductive shielding layer are exposed from the adhesive layer to present a geometric pattern.

According to a first operable embodiment of the method of the present invention, in the step (A), the cavities are formed on the substrate material through hot stamping; and the conductive shielding layer is then formed on a top of the substrate material and in the cavities.

According to a second operable embodiment of the method of the present invention, in the step (A), the conductive shielding layer is formed on a top of the substrate material; and then, the substrate material and the conductive shielding layer are hot stamped at the same time to form the cavities.

According to a third operable embodiment of the method of the present invention, in the step (A), the cavities are formed on the substrate material through hot stamping; a layer of electrically conductive material is then formed on a top of the substrate material and the electrically conductive material is subjected to a surface passivation treatment; and the conductive shielding layer is formed on a top of the electrically conductive material.

The present invention is characterized in that, by forming the conductive shielding layer and the metal grounding electrodes and by filling the adhesive layer in the large area of filling spaces among the metal grounding electrodes, the shielding film of the present invention has good electrical conduction property and accordingly, provides enhanced electromagnetic shielding effect. And, with the above arrangements, it is not necessary to add conductive particles to the adhesive layer, enabling the adhesive layer in the present invention to have increased bonding strength. Further, the shielding film manufacturing method of the present invention has simplified procedures to enable reduced manufacturing cost and increased industrial applicability.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein

FIG. 9 is a flowchart showing the steps included in a first embodiment of a shielding film manufacturing method according to the present invention;

FIG. 22 is a flowchart showing the steps included in a seventh embodiment of the shielding film manufacturing method according to the present invention;

DETAILED DESCRIPTION OF THE PREFERRED EMBODIMENTS

Figure 1:
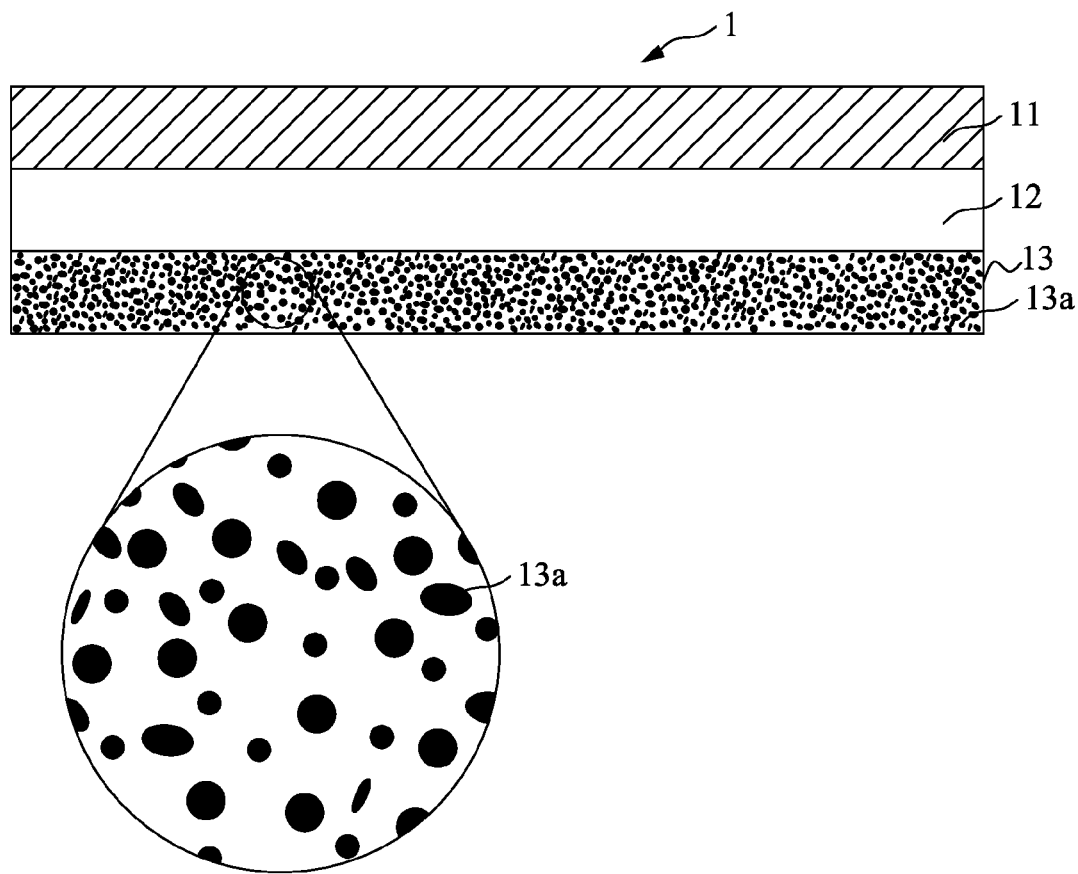
FIG. 1 is a schematic view showing the structure of a conventional shielding film.

The present invention will now be described with some preferred embodiments thereof and by referring to the accompanying drawings. For the purpose of easy to understand, elements that are the same in the preferred embodiments are denoted by the same reference numerals.

Figure 2A:
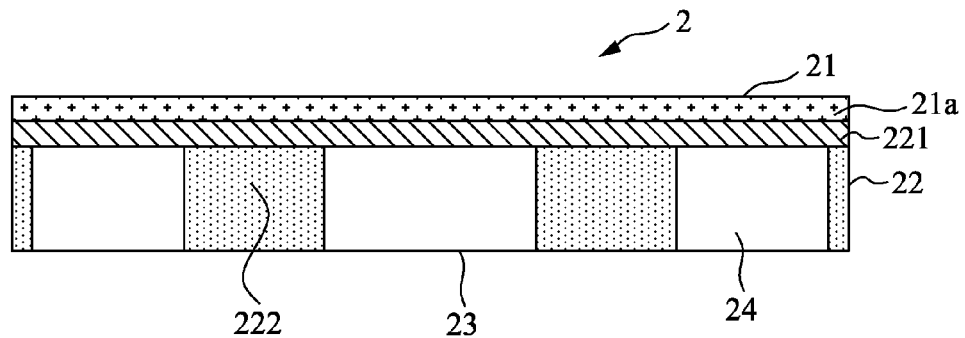
FIGS. 2A to 2E are vertical sectional views showing the structure of a shielding film according to a first embodiment of the present invention.

Please refer to FIG. 2A that is a vertical sectional view showing the structure of a shielding film 2 according to a first embodiment of the present invention includes an insulation layer 21, at least one electrically conductive shielding layer 22, and an adhesive layer 24.

As can be seen in FIG. 2A, the insulation layer 21 is a simple structure formed of a first insulation material 21*a*, which has a thickness ranged between 5 μm and 25 μm and can be at least one of polyimide (PI), polyethylene terephthalate (PET), polycarbonate (PC), and polyphenylsulfone (PPSU). Preferably, the first insulation material 21*a* has a black color for the shielding film 2 of the present invention to provide even better electromagnetic shielding effect.

The conductive shielding layer 22 is connected at an upper side to a lower side of the insulation layer 21 and is formed of a metal shielding material 221. The metal shielding material 221 has a thickness ranged between 0.1 μm and 15 μm, and can be at least one of copper (Cu), silver (Ag), aluminum (Al), nickel (Ni), zinc (Zn), tin (Sn), iron (Fe), carbon (C), graphite, graphene, and an electrically conductive polymeric material.

As shown in FIG. 2A, a plurality of metal grounding electrodes 222 is provided on a lower side of the metal shielding material 221 to protrude in a direction opposite to the first insulation material 21*a*. The metal grounding electrodes 222 respectively have a height ranged between 3 μm and 30 μm, and can be formed of at least one of copper (Cu), silver (Ag), aluminum (Al), nickel (Ni), zinc (Zn), tin (Sn), iron (Fe), carbon (C), graphite and graphene.

The metal grounding electrodes 222 distributed over the lower side of the metal shielding material 221 together present a geometric pattern on the lower side of the conductive shielding layer 22. The patterned metal grounding electrodes 222 define a plurality of relatively large filling spaces 23 among them, and the filling spaces 23 account for about 65% to 99% of a total area of the conductive shielding layer 22. The adhesive layer 24 is filled in the filling spaces 23.

The adhesive layer 24 can be at least one of a thermosetting epoxy resin, acrylic acid, polyurethane, and polyimide.

Figure 2B:
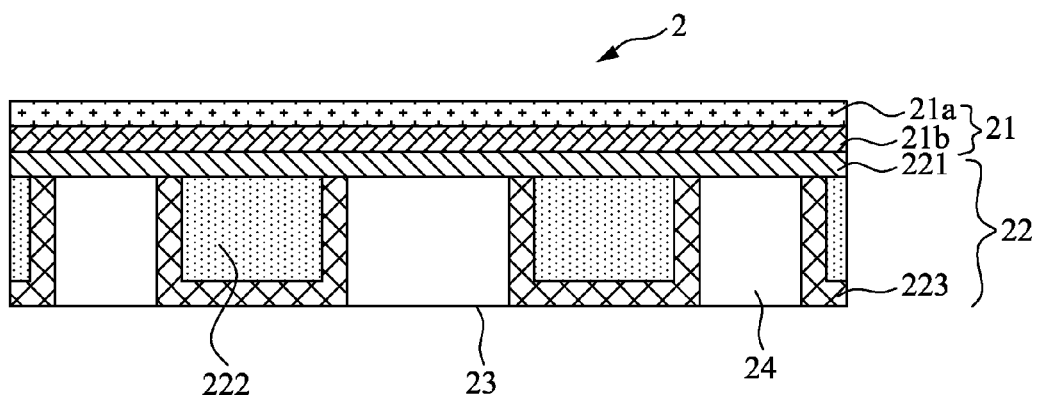

Please refer to FIG. 2B. According to the first embodiment of the shielding film 2, the insulation layer 21 can be a composite material formed of the first insulation material 21*a* and a bonding material 21*b* located between the first insulation material 21*a* and the metal shielding material 221. The bonding material 21*b* has a thickness ranged between 0.01 μm and 10 μm, and can be formed of at least one of nickel (Ni), tin (Sn), zinc (Zn), silver (Ag), copper (Cu), aluminum (Al), titanium (Ti), chromium (Cr), molybdenum (Mo), tungsten (W), iron (Fe), vanadium (V), cobalt (Co), niobium (Nb) and a polymeric material, or can be an oxide of at least one of the aforesaid materials. Further, the conductive shielding layer 22 further includes a weatherproof layer 223 covering surfaces of the metal grounding electrodes 222. The weatherproof layer 223 has a thickness ranged between 0.005 μm and 1 μm, and can be at least one of nickel (Ni), tin (Sn), zinc (Zn), silver (Ag), copper (Cu), aluminum (Al), titanium (Ti), chromium (Cr), molybdenum (Mo), tungsten (W), iron (Fe) and vanadium (V), or can be an oxide of at least one of the aforesaid metal materials.

Figure 2C:
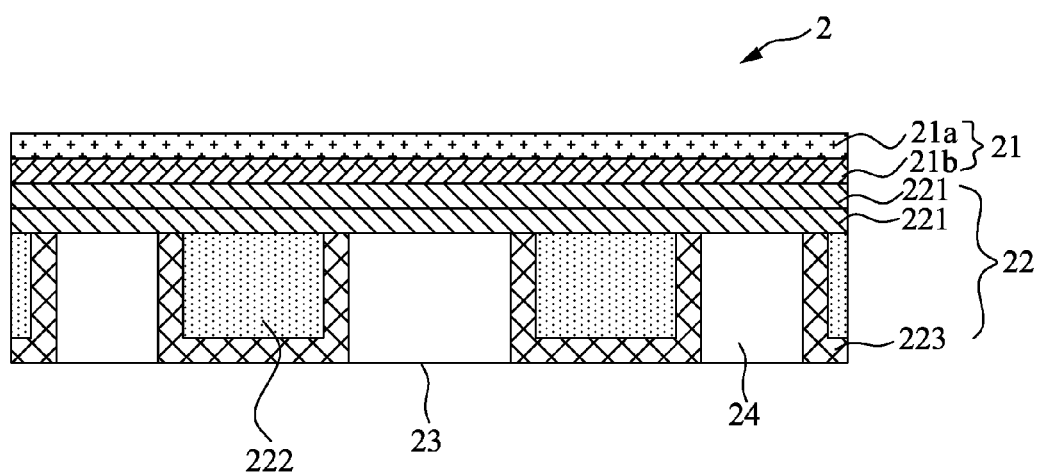

According to the first embodiment of the shielding film 2 shown in FIG. 2B, the conductive shielding layer 22 can include multiple layers of the metal shielding material 221, as shown in FIG. 2C.

Figure 2D:
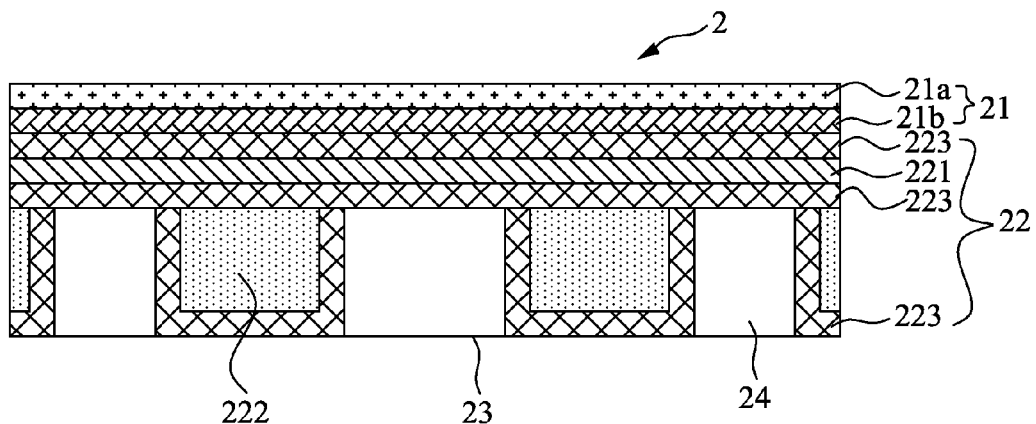

According to the first embodiment of the shielding film 2 shown in FIG. 2B, the weatherproof layer 223 can be further formed on one or both of the upper and the lower side of the metal shielding material 221, as shown in FIG. 2D.

Figure 2E:
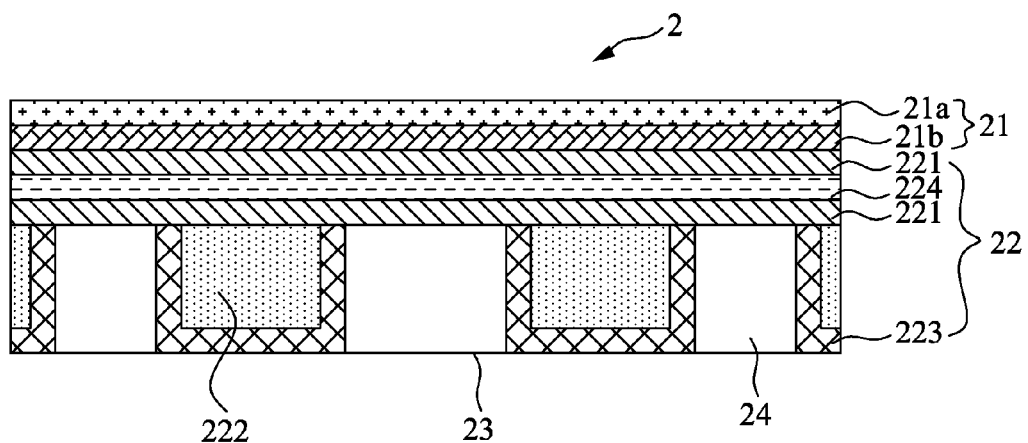

According to the first embodiment of the shielding film 2 shown in FIG. 2C, at least one second insulation material 224 can be further provided in the conductive shielding layer 22 to locate between two adjacent metal shielding layers 221, as shown in FIG. 2E.

Figure 3A:
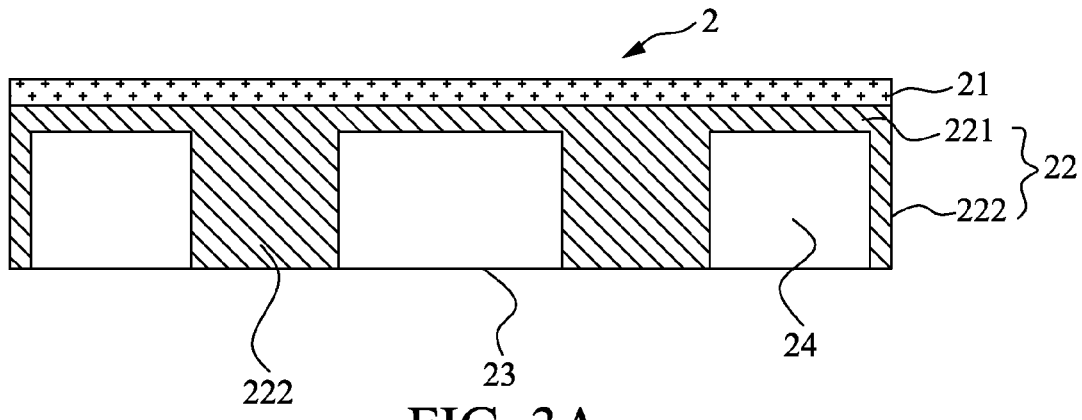
FIGS. 3A to 3E are vertical sectional views showing the structure of a shielding film according to a second embodiment of the present invention.

FIG. 3A is a vertical sectional view showing the structure of a shielding film 2 according to a second embodiment of the present invention includes an insulation layer 21, at least one electrically conductive shielding layer 22, and an adhesive layer 24. The conductive shielding layer 22 includes a metal shielding material 221 connected at an upper side to a lower side of the insulation layer 21. A part area of the metal shielding material 221 is downward protruded to form a plurality of metal grounding electrodes 222, which together present a geometric pattern to define a plurality of filling spaces 23 among them, and the adhesive layer 24 is filled in the filling spaces 23.

Figure 3B:
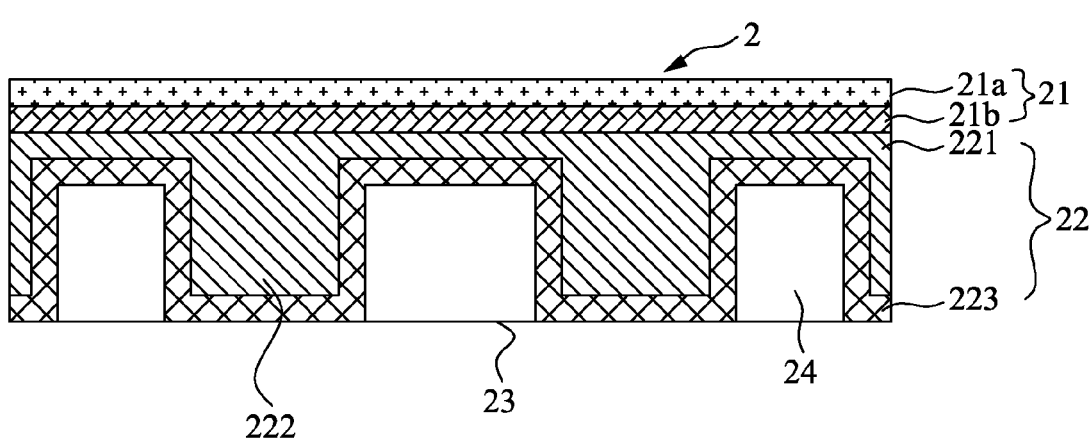

Please refer to FIG. 3B. According to the second embodiment of the shielding film 2, the insulation layer 21 can further include a bonding material 21*b*, and the conductive shielding layer 22 can further include a weatherproof layer 223 to cover a lower side of the metal shielding material 221. Then, the adhesive layer 24 is formed in the filling spaces 23 defined among the metal grounding electrodes 222.

Figure 3C:
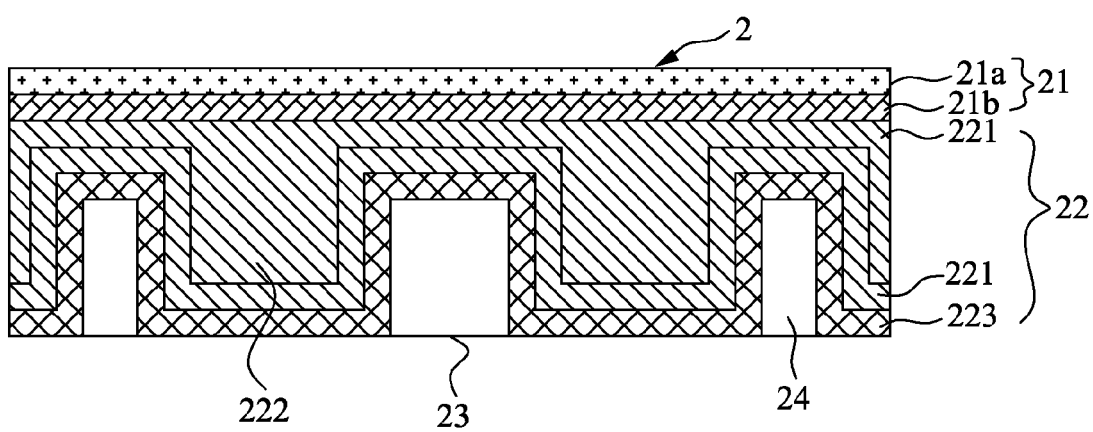

According to the second embodiment of the shielding film 2 shown in FIG. 3B, the conductive shielding layer 22 can include multiple layers of the metal shielding material 221, as shown in FIG. 3C.

Figure 3D:
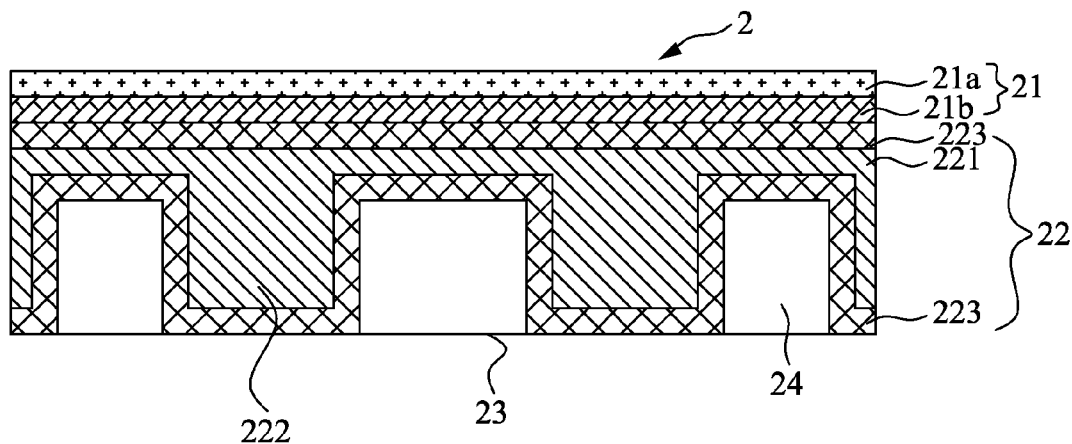

According to the second embodiment of the shielding film 2 shown in FIG. 3B, the weatherproof layer 223 can be further formed on one or both of the upper and the lower side of the metal shielding material 221, as shown in FIG. 3D.

Figure 3E:
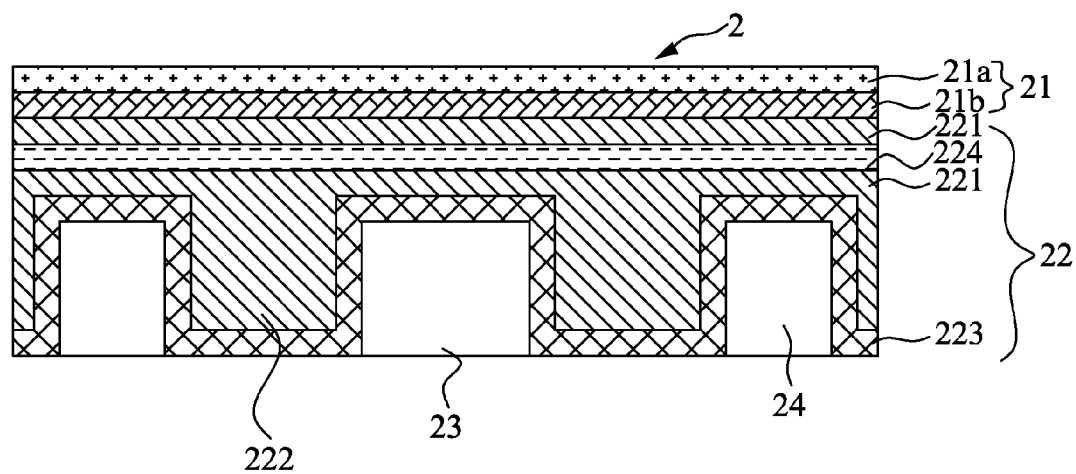

According to the second embodiment of the shielding film 2 shown in FIG. 3C, at least one second insulation material 224 can be further provided in the conductive shielding layer 22 to locate between two adjacent metal shielding layers 221, as shown in FIG. 3E.

Figure 4A:
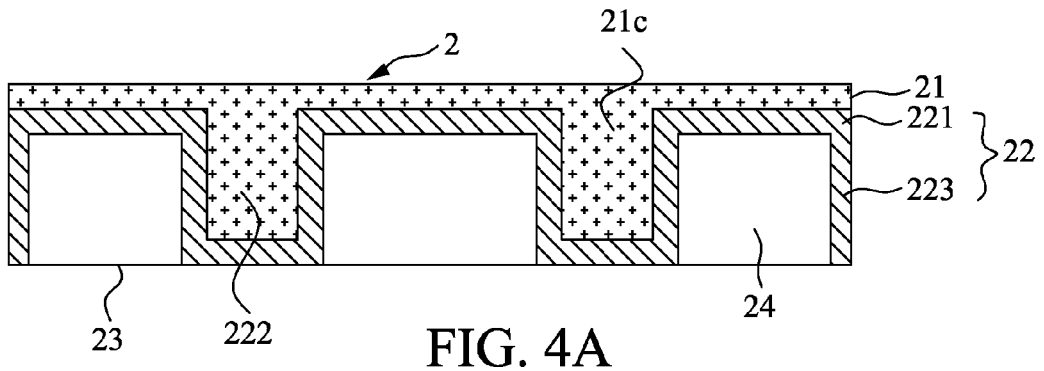
FIGS. 4A to 4E are vertical sectional views showing the structure of a shielding film according to a third embodiment of the present invention.

FIG. 4A is a vertical sectional view showing the structure of a shielding film 2 according to a third embodiment of the present invention includes an insulation layer 21, at least one electrically conductive shielding layer 22, and an adhesive layer 24. A part area of the insulation layer 21 is downward extended from a lower side thereof to form a plurality of first protruded portions 21c; and the conductive shielding layer 22 includes a metal shielding material 221 connected to the lower side of the insulation layer 21. Portions of the metal shielding material 221 corresponding to the downward first protruded portions 21c respectively form a metal grounding electrode 222. The metal grounding electrodes 222 together present a geometric pattern to define a plurality of filling spaces 23 among them, and the adhesive layer 24 is filled in the filling spaces 23.

Figure 4B:
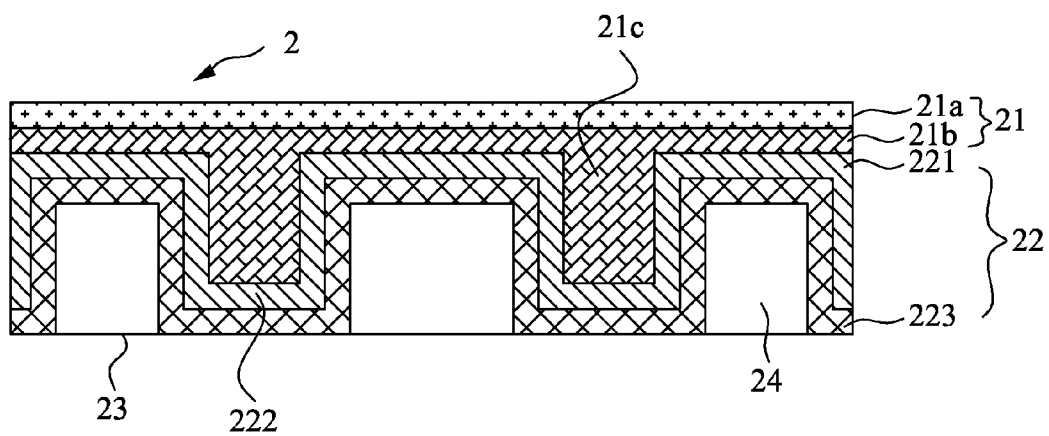

Please refer to FIG. 4B. According to the third embodiment of the shielding film 2, the insulation layer 21 can further include a bonding material 21b, and the conductive shielding layer 22 can further include a weatherproof layer 223 to cover a lower side of the metal shielding material 221. Then, the adhesive layer 24 is formed in the filling spaces 23 defined among the metal grounding electrodes 222.

Figure 4C:
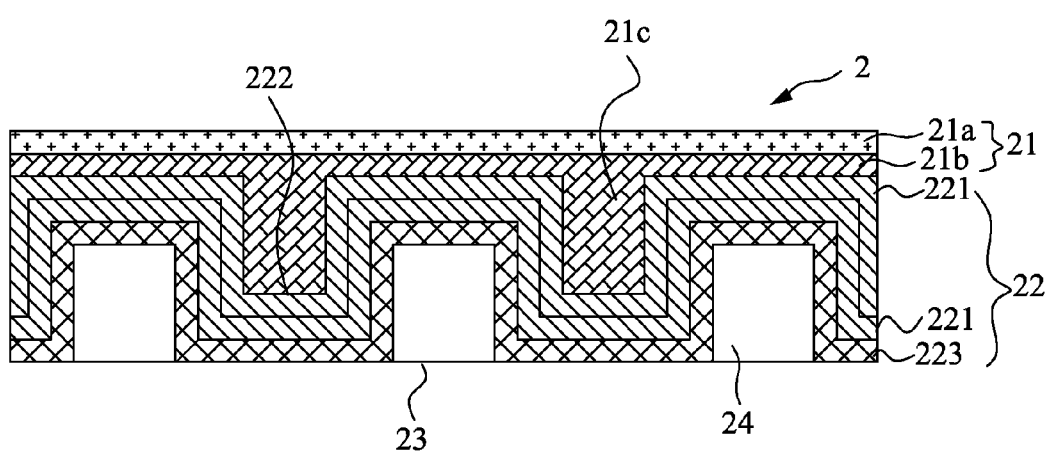

According to the third embodiment of the shielding film 2 shown in FIG. 4B, the conductive shielding layer 22 can include multiple layers of the metal shielding material 221, as shown in FIG. 4C.

Figure 4D:
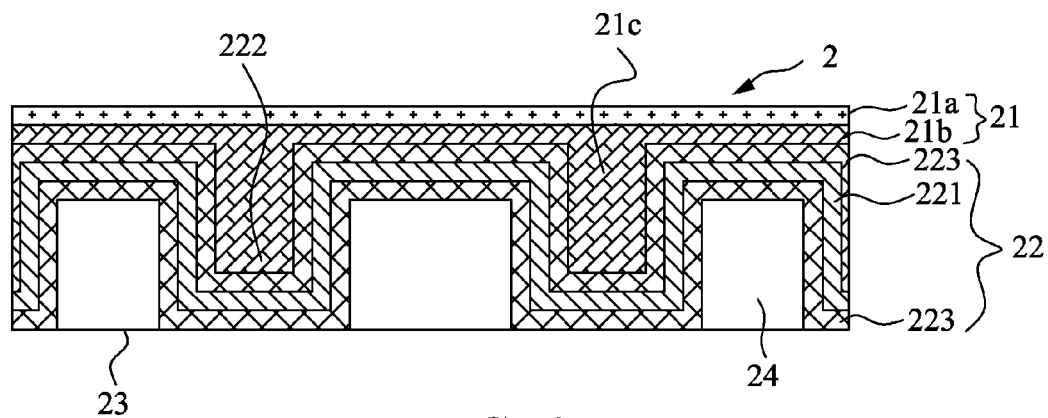

According to the third embodiment of the shielding film 2 shown in FIG. 4B, the weatherproof layer 223 can be further formed on one or both of the upper and the lower side of the metal shielding material 221, as shown in FIG. 4D.

Figure 4E:
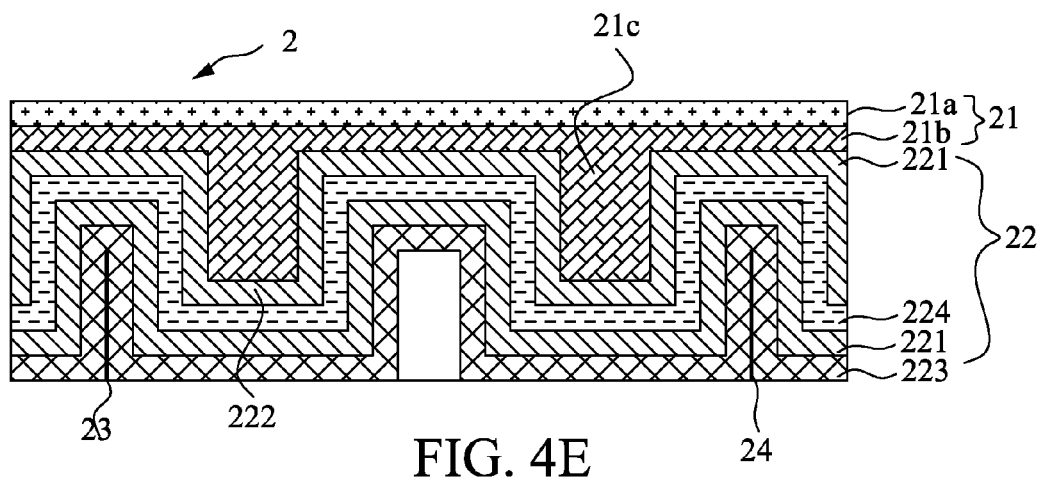

According to the third embodiment of the shielding film 2 shown in FIG. 4C, at least one second insulation material 224 can be further provided in the conductive shielding layer 22 to locate between two adjacent metal shielding layers 221, as shown in FIG. 4E.

Figure 5A:
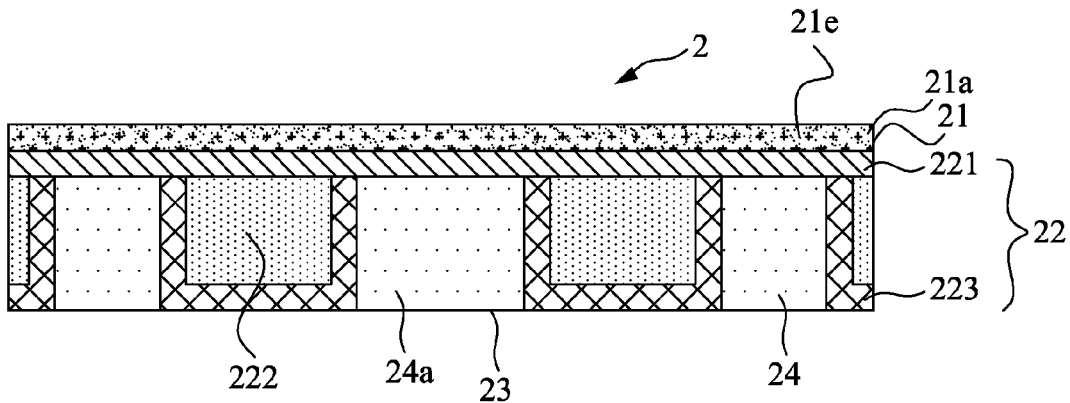
FIGS. 5A to 5C are vertical sectional views showing the structure of a shielding film according to a fourth embodiment of the present invention.
Figure 5B:
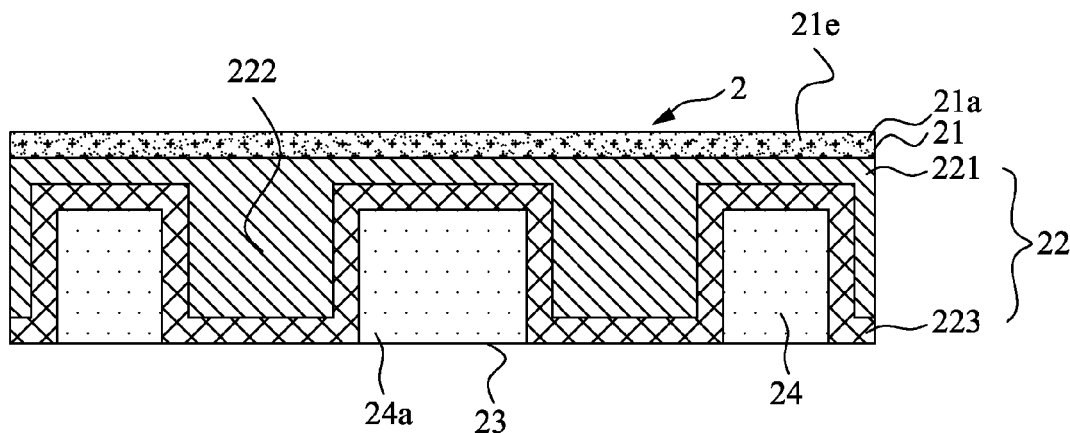
Figure 5C:
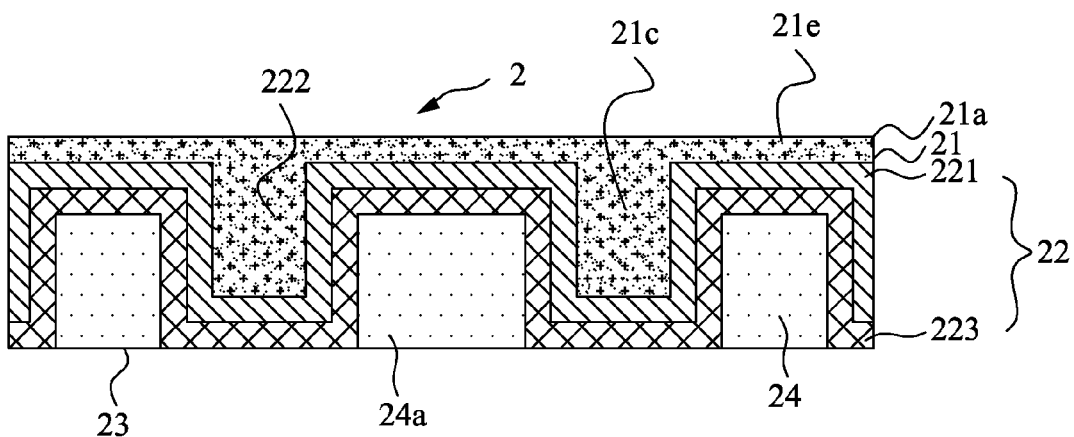

FIGS. 5A to 5C are vertical sectional views showing the structure of a shielding film 2 according to a fourth embodiment of the present invention includes an insulation layer 21, an electrically conductive shielding layer 22, and an adhesive layer 24. A part area of the conductive shielding layer 22 is downward protruded to form a plurality of metal grounding electrodes 222, which together present a geometric pattern on the lower side of the conductive shielding layer 22. The patterned metal grounding electrodes 222 define a plurality of relatively large filling spaces 23 among them, and the adhesive layer 24 is filled in the filling spaces 23. In the insulation layer 21, particles 21e of at least one type of electrically insulating, heat conductive material are added. The electrically insulating, heat conductive material can be aluminum oxide ($Al_2O_3$), aluminum nitride (AlN), boron nitride (BN), silicon carbide (SiC), magnesium oxide (MgO), zinc oxide (ZnO), nickel oxide (NiO), Silicon dioxide ($SiO_2$), silicon nitride ($Si_3N_4$), powder carbon (C), or a polymer-based insulating heat-conductive material. And, in the adhesive layer 24, metal particles 24a are contained.

In the fourth embodiment, the conductive shielding layer 22 includes a metal shielding material 221 connected at an upper side to a lower side of the insulation layer 21, and the downward protruded metal grounding electrodes 222 are provided on a lower side of the metal shielding material 221, as shown in FIG. 5A. According to the fourth embodiment, the conductive shielding layer 22 can include multiple layers of the metal shielding material 221, similar to that shown in FIG. 2C; or one or more weatherproof layers 223 can be further formed on one or both of the upper and the lower side of the metal shielding material 221, similar to that shown in FIG. 2D; or at least one second insulation material 224 can be further provided in the conductive shielding layer 22 to locate between two adjacent metal shielding layers 221, similar to that shown in FIG. 2E.

Please refer to FIG. 5B. According to a first variant of the fourth embodiment, the conductive shielding layer 22 includes a metal shielding material 221 connected at an upper side to a lower side of the insulation layer 21, and a part area of the metal shielding material 221 is downward protruded to form a plurality of metal grounding electrodes 222. According to this first variant, the conductive shielding layer 22 can include multiple layers of the metal shielding material 221, similar to that shown in FIG. 3C; or one or more weatherproof layers 223 can be further formed on one or both of the upper and the lower side of the metal shielding material 221, similar to that shown in FIG. 3D; or at least one second insulation material 224 can be further provided in the conductive shielding layer 22 to locate between two adjacent metal shielding layers 221, similar to that shown in FIG. 3E.

Please refer to FIG. 5C. According to a second variant of the fourth embodiment, a part area of the insulation layer 21 is downward extended from a lower side thereof to form a plurality of first protruded portions 21c; and the conductive shielding layer 22 includes a metal shielding material 221 connected to the lower side of the insulation layer 21. Portions of the metal shielding material 221 corresponding to the downward first protruded portions respectively form a metal grounding electrode 222. According to this second variant, the conductive shielding layer 22 can include multiple layers of the metal shielding material 221, similar to that shown in FIG. 4C; or one or more weatherproof layers 223 can be further formed on one or both of the upper and the lower side of the metal shielding material 221, similar to that shown in FIG. 4D; or at least one second insulation material 224 can be further provided in the conductive shielding layer 22 to locate between two adjacent metal shielding layers 221, similar to that shown in FIG. 4E.

In the fourth embodiment and the variants thereof, with the metal grounding electrodes 222, the insulation layer 21 containing particles 21e of at least one electrically insulating, heat conductive material, and the adhesive layer 24 containing metal particles 24a, the shielding film 2 of the present invention provides not only good grounding effect, but also good heat dissipation effect.

Figure 6A:
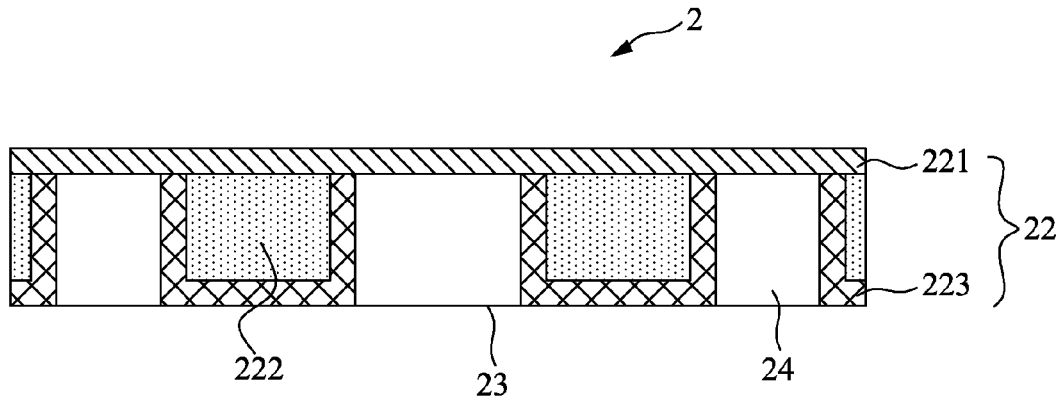
FIGS. 6A to 6C are vertical sectional views showing the structure of a shielding film according to a fifth embodiment of the present invention.
Figure 6B:
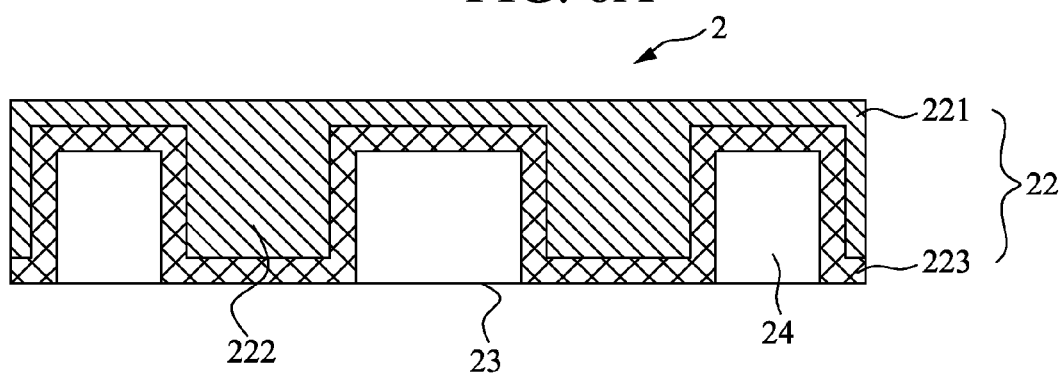
Figure 6C:
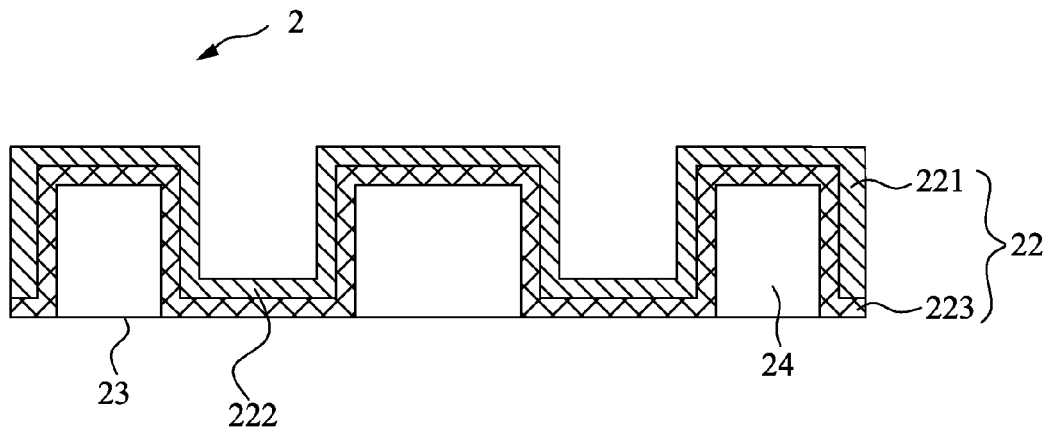

FIGS. 6A to 6C are vertical sectional views showing the structure of a shielding film 2 according to a fifth embodiment of the present invention includes an electrically conductive shielding layer 22, and an adhesive layer 24. A part area of the conductive shielding layer 22 is downward protruded to form a plurality of metal grounding electrodes 222, which together present a geometric pattern on the lower side of the conductive shielding layer 22. The patterned metal grounding electrodes 222 define a plurality of relatively large filling spaces 23 among them, and the adhesive layer 24 is filled in the filling spaces 23.

In the fifth embodiment, as shown in FIG. 6A, the conductive shielding layer 22 includes a metal shielding material 221, and the downward protruded metal grounding electrodes 222 are located on a lower side of the metal shielding material 221, According to the fifth embodiment, the conductive shielding layer 22 can include multiple layers of the metal shielding material 221, similar to that shown in FIG. 2C; or one or more weatherproof layers 223 can be further formed on one or both of the upper and the lower side of the metal shielding material 221, similar to that shown in FIG. 2D; or at least one second insulation material 224 can be further provided in the conductive shielding layer 22 to locate between two adjacent metal shielding layers 221, similar to that shown in FIG. 2E.

Please refer to FIG. 6B. According to a first variant of the fifth embodiment, the conductive shielding layer 22 includes a metal shielding material 221, and a part area of the metal shielding material 221 is downward protruded to form a plurality of metal grounding electrodes 222. According to this first variant, the conductive shielding layer 22 can include multiple layers of the metal shielding material 221, similar to that shown in FIG. 3C; or one or more weatherproof layers 223 can be further formed on one or both of the upper and the lower side of the metal shielding material 221, similar to that shown in FIG. 3D; or at least one second insulation material 224 can be further provided in the conductive shielding layer 22 to locate between two adjacent metal shielding layers 221, similar to that shown in FIG. 3E.

Please refer to FIG. 6C. According to a second variant of the fifth embodiment, the conductive shielding layer 22 includes a metal shielding material 221, which is formed into a plurality of metal grounding electrodes 222. According to this second variant, the conductive shielding layer 22 can include multiple layers of the metal shielding material 221, similar to that shown in FIG. 4C; or one or more weatherproof layers 223 can be further formed on one or both of the upper and the lower side of the metal shielding material 221, similar to that shown in FIG. 4D; or at least one second insulation material 224 can be further provided in the conductive shielding layer 22 to locate between two adjacent metal shielding layers 221, similar to that shown in FIG. 4E.

According to the fifth embodiment, the shielding film 2 of the present invention does not necessarily include an insulation layer 21 and can be directly attached to an enclosure of an electronic product. In this manner, the electromagnetic wave generated by the electronic product can be shielded by the metal shielding layer 221 and grounded via the metal grounding electrodes 222 of the shielding film 2 to achieve good grounding effect.

In the fifth embodiment, the bonding material 21b and the weatherproof layer 23 can be provided according to the requirements of the manufacturing process of the shielding film 2. That is, the bonding material 21b and the weatherproof layer 23 can be omitted at the same time, or only the bonding material 21b is provided, or only the weatherproof layer 223 is provided, or the bonding material 21b and the weatherproof layer 223 can be provided at the same time.

Figure 7A:
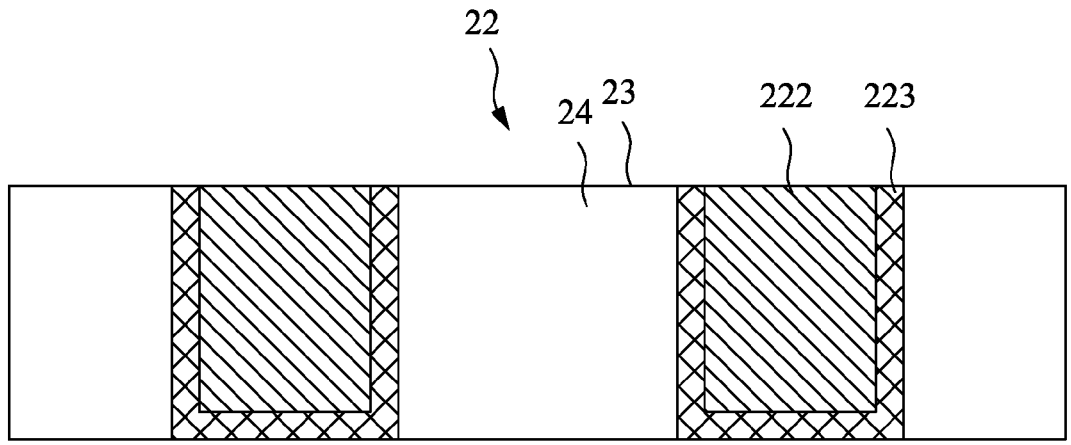
FIGS. 7A to 7C are vertical sectional views showing some different sectional configurations for a conductive shielding layer included in the shielding film of the present invention.
Figure 7B:
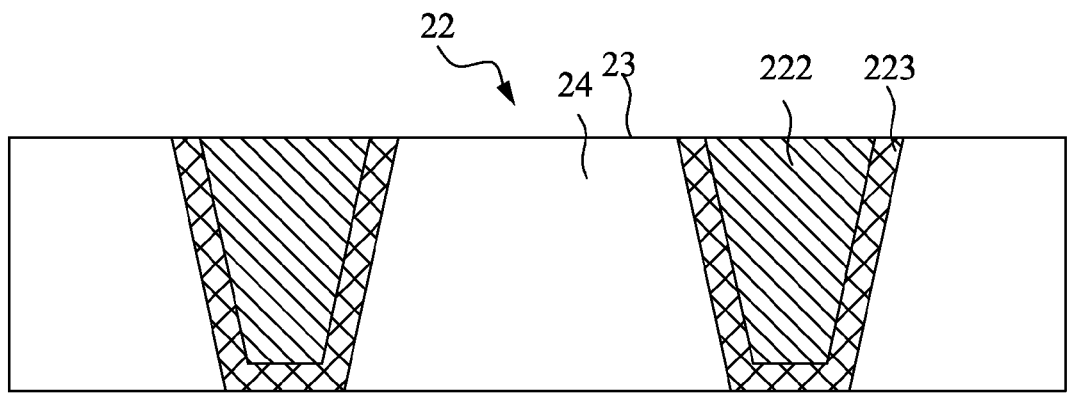
Figure 7C:
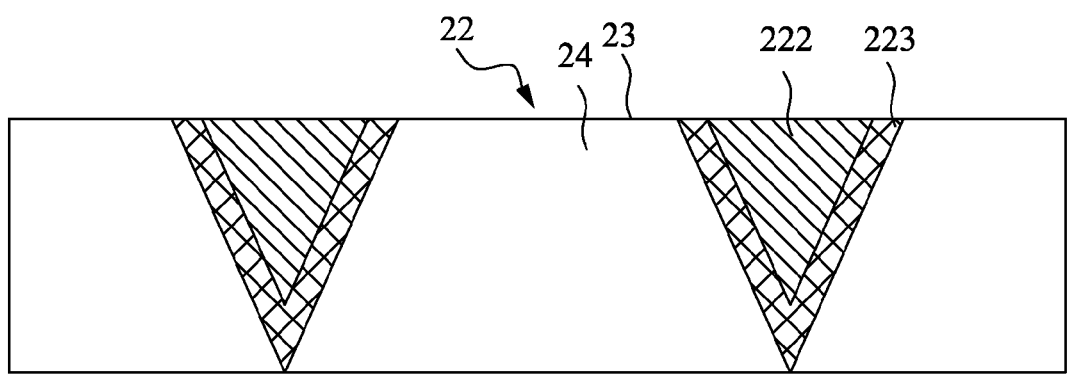

FIGS. 7A to 7C are vertical sectional views showing some possible geometric shapes for the configurations of the metal grounding electrodes 222 of the conductive shielding layer 22 according to the present invention. In FIG. 7A, the metal grounding electrodes 222 have a rectangular cross section. In FIG. 7B, the metal grounding electrodes 222 have a trapezoidal cross section. In FIG. 7C, the metal grounding electrodes 222 have an inverted pyramid cross section.

Figure 8A:
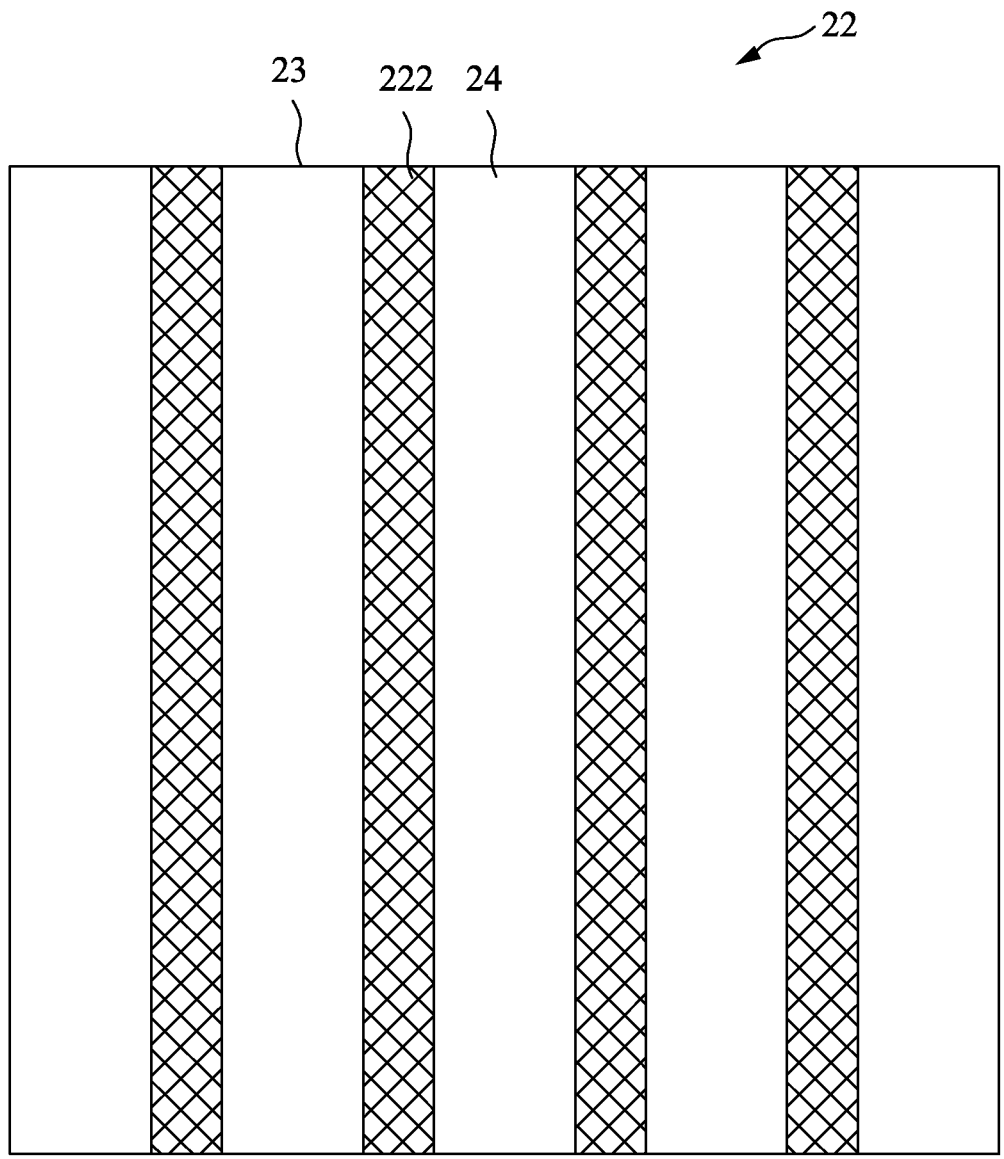
FIGS. 8A to 8D are top views showing some different geometric patterns that can be presented by the conductive shielding layer included in the shield film of the present invention.
Figure 8B:
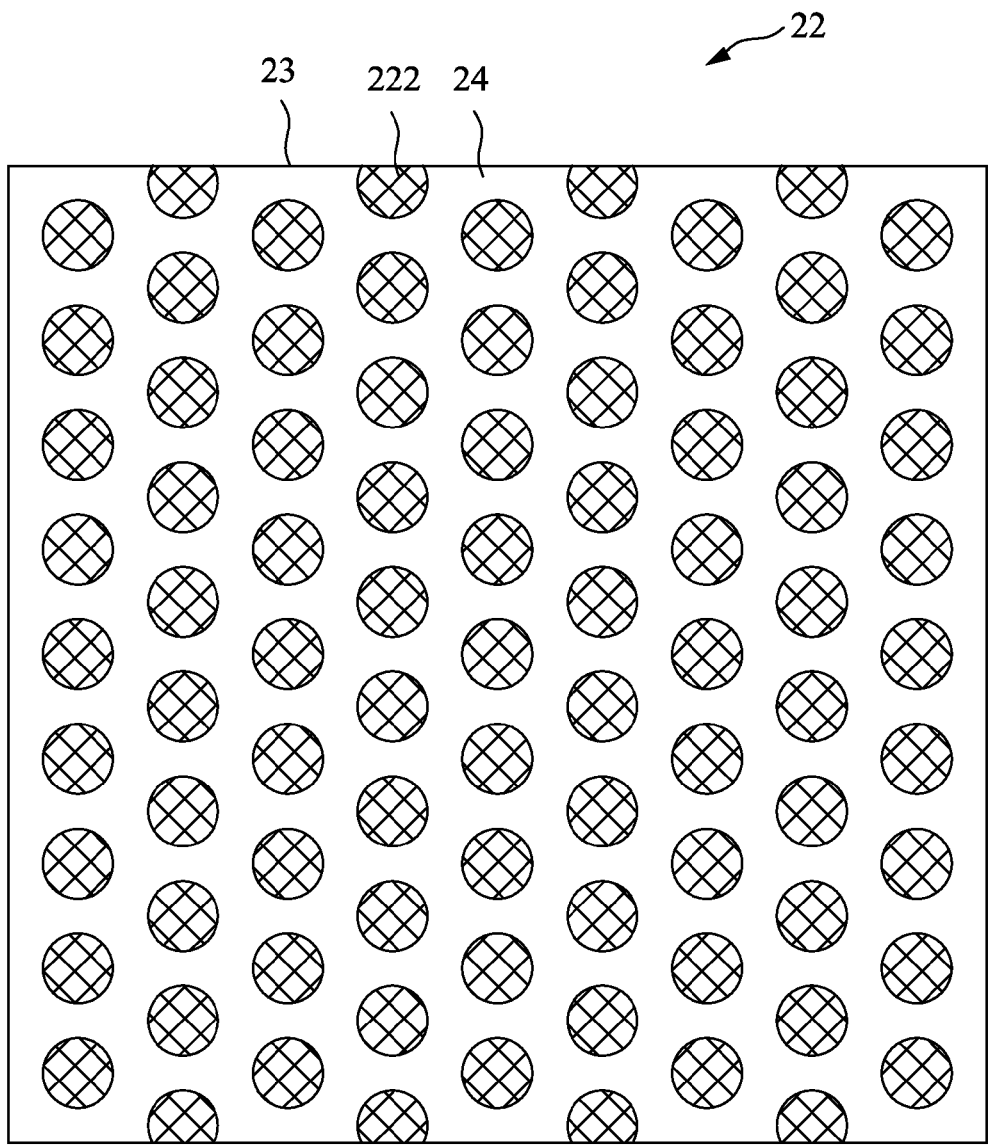
Figure 8C:
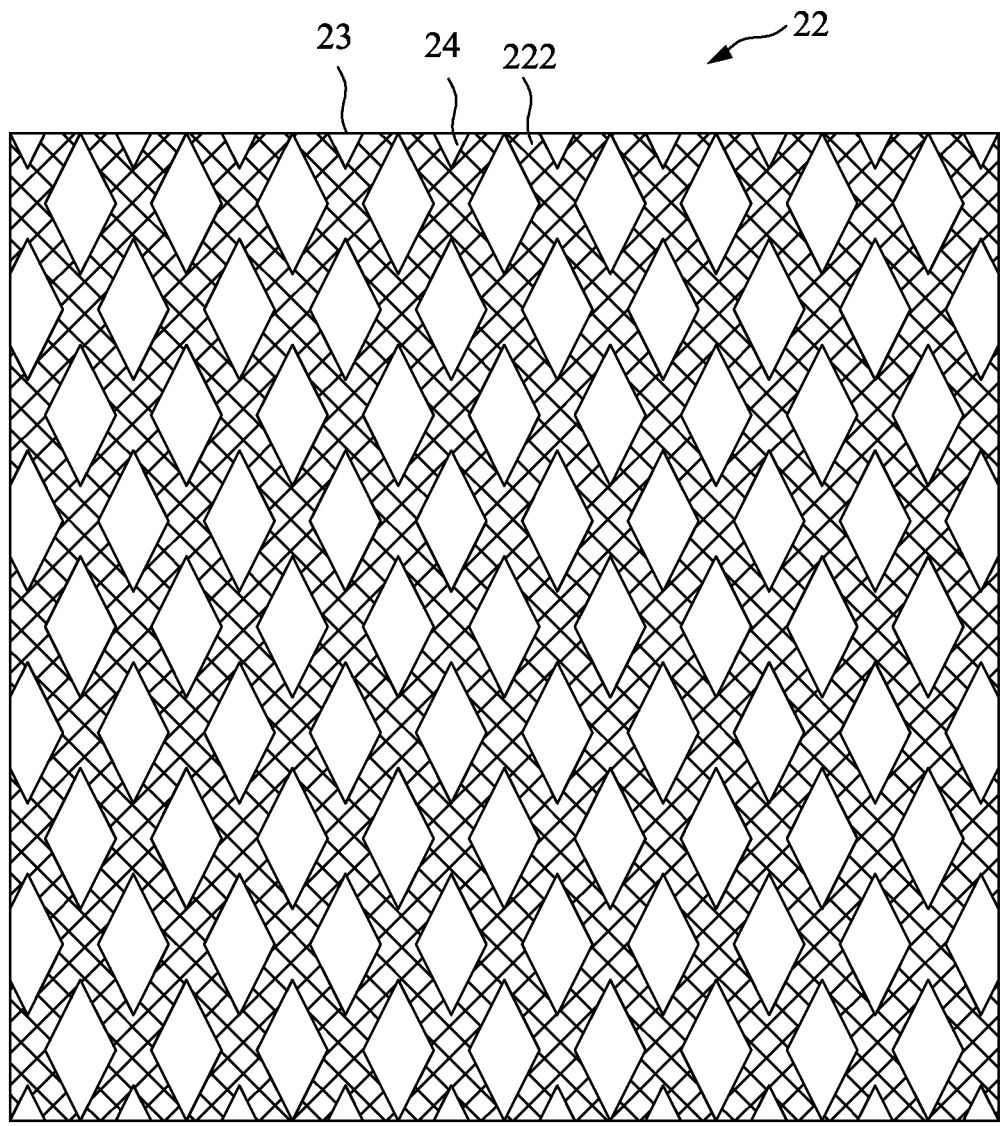
Figure 8D:
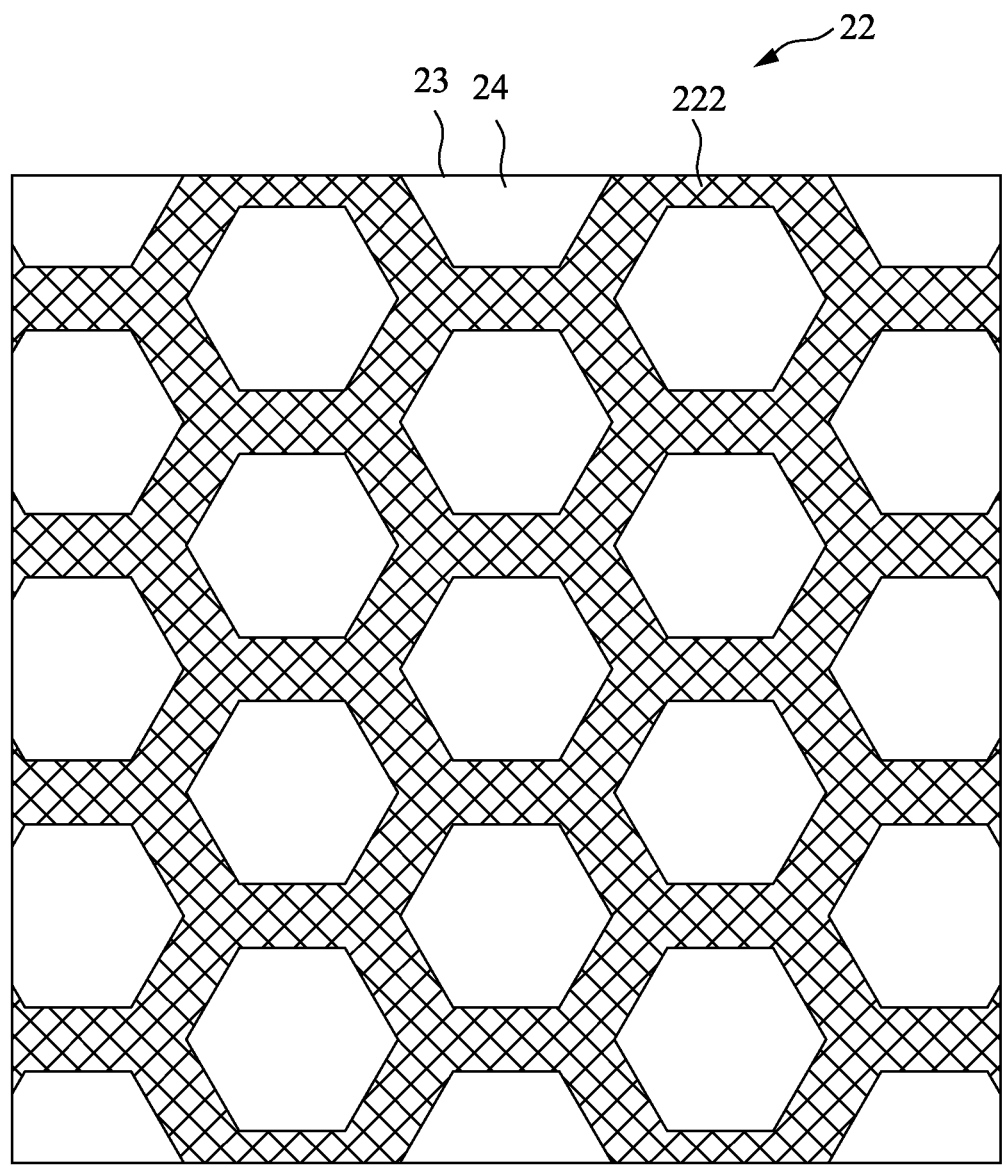

FIGS. 8A to 8D are top views showing some different geometric patterns that can be presented by the metal grounding electrodes 222 on the conductive shielding layer 22 for the shield film 2 of the present invention. In any one of these geometric patterns, the filling spaces 23 defined among the metal grounding electrodes 222 are always filled up by the adhesive layer 24. In FIG. 8A, the metal grounding electrodes 222 are arranged in a plurality of straight rows. In FIG. 8B, the metal grounding electrodes 222 are arranged in a plurality of round posts. In FIG. 8C, the metal grounding electrodes 222 are arranged in a diamond-shaped grid. In FIG. 8D, the metal grounding electrodes 222 are arranged in a hexagon-shaped grid.

Figure 10:
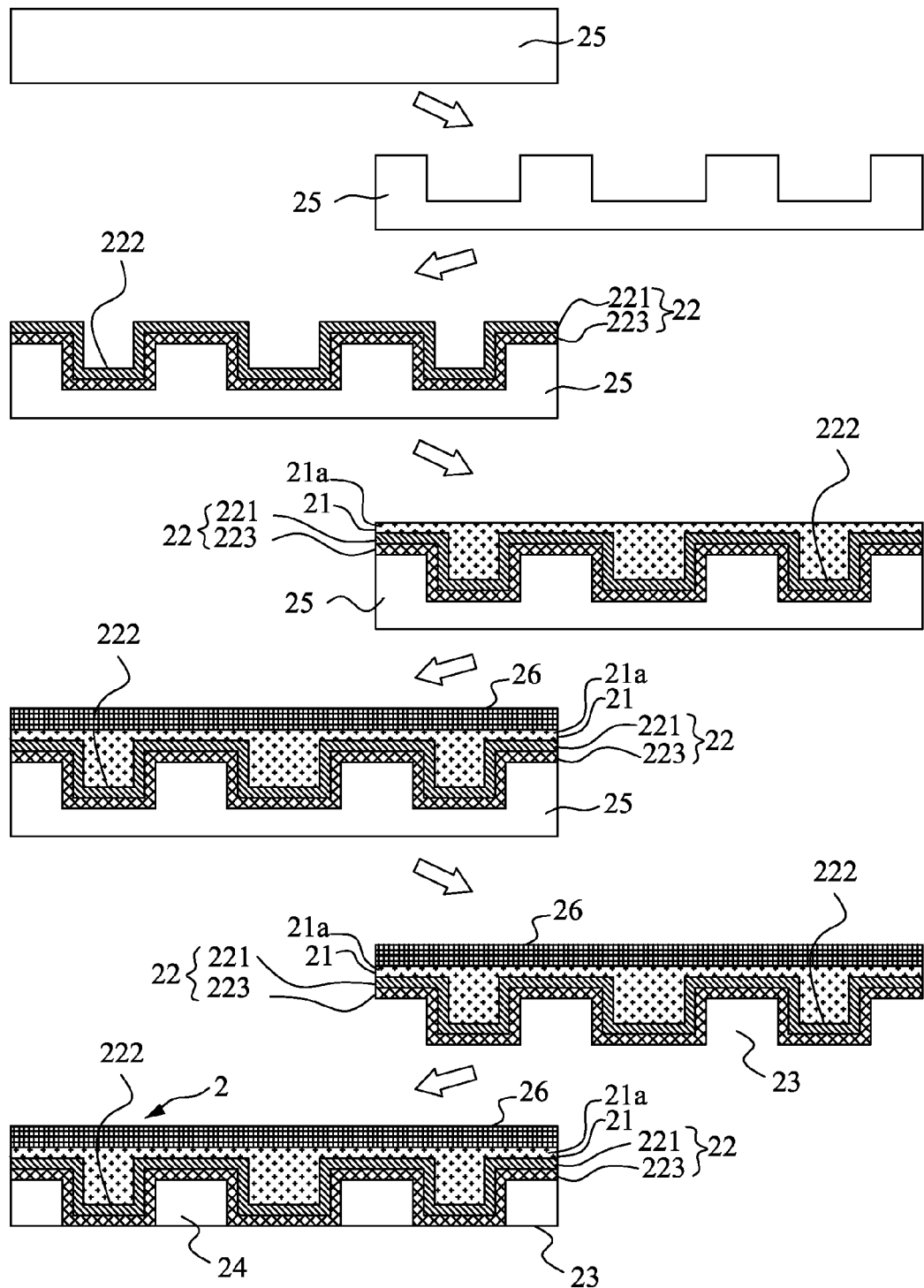
FIGS. 10 to 11 are a pictorial description of the steps shown in FIG. 9.

The present invention also provides a method of manufacturing a shielding film 2. Please refer to FIG. 9 that is a flowchart showing the steps included in a first embodiment of the shielding film manufacturing method of the present invention, and to FIG. 10 that is a pictorial description of the steps in the flowchart of FIG. 9. The following is a detailed description of these steps, which are numbered from (A) to (E) herein for ease of reference.

Step (A): Form a plurality of cavities on a substrate material 25 through hot stamping on an embossing machine, and then form an electrically conductive shielding layer 22 on a top of the substrate material 25 and the cavities through sputtering deposition on a sputtering machine, or through vapor deposition or chemical deposition on a vapor deposition machine, such that the substrate material 25 and the conductive shielding layer 22 are connected to each other and correspondingly form a cavity-showing pattern having a plurality of cavities. Wherein, the hot stamping is performed on the embossing machine at a temperature from about 100 to about 200° C.

Step (B): Form an insulation layer 21 on a top of the conductive shielding layer 22 using a coating machine, such that the insulation layer 21 fills up the cavities. The insulation layer 21 can be a simple structure formed of a first insulation material 21a or a composite structure formed of a first insulation material 21a and a bonding material 21b located below the first insulation material 21a.

Step (C): Form a carrier film 26 on a top of the insulation layer 21. The carrier film 26 can be polyethylene terephthalate (PET), which will be removed when the shielding film 2 is ready for use.

Step (D): Remove the substrate material 25 from a lower side of the conductive shielding layer 22, so as to expose the cavity-showing pattern formed in the step (A) through hot stamping on the embossing machine. The cavity-showing pattern is downward protruded from the lower side of the conductive shielding layer 22 to form a plurality of metal grounding electrodes 222, among which a plurality of filling spaces 23 is defined.

Step (E): Fill an adhesive layer 24 in the filling spaces 23, such that the metal grounding electrode 222 is exposed from the lower side of the conductive shielding layer 22 to present a geometric pattern.

Figure 11:
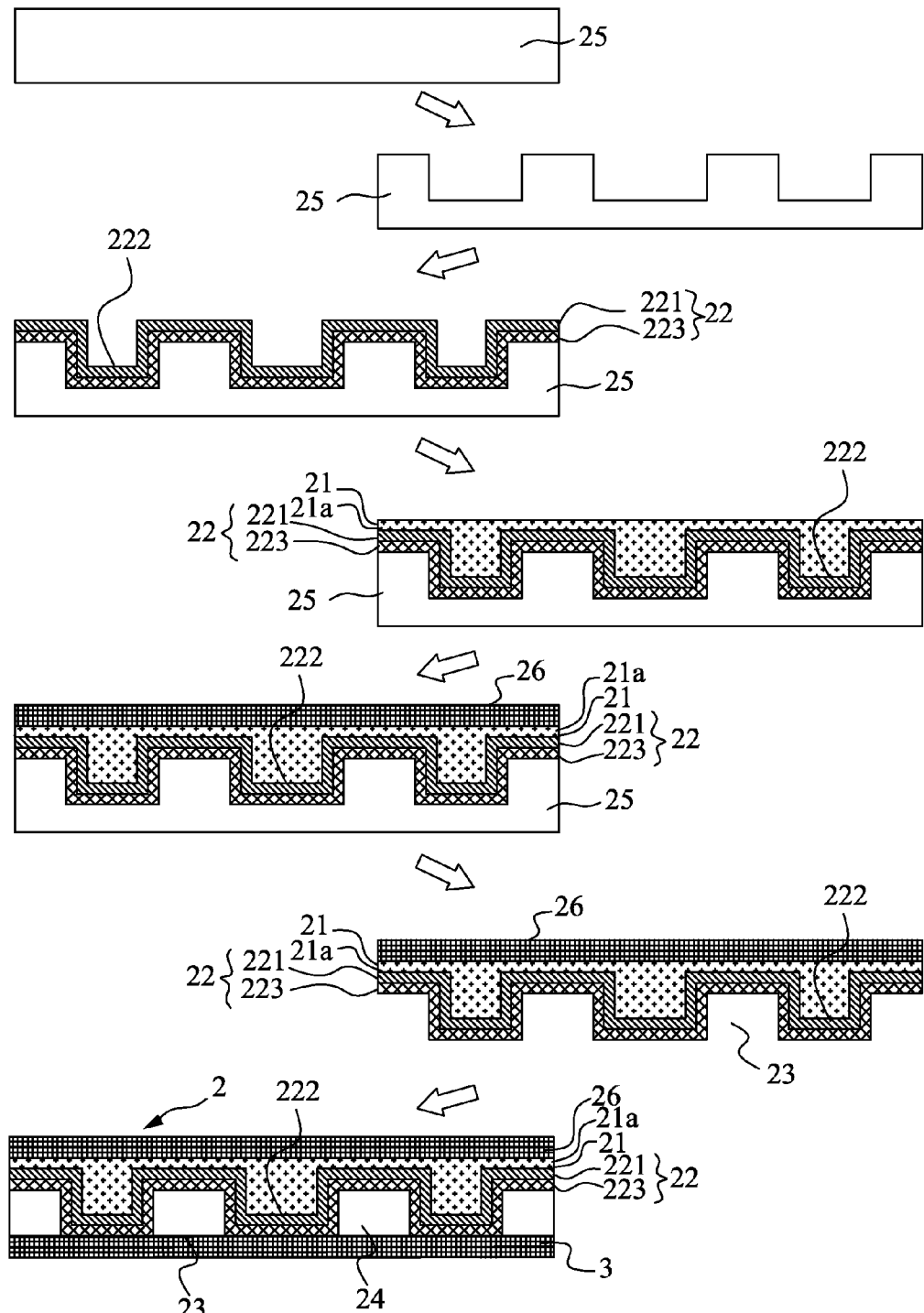

Please refer to FIG. 11. According to an operable embodiment, a step can be further included after the steps (A) to (E) of the first embodiment: Provide a release material 3 on the adhesive layer 24 and the exposed surfaces of the metal grounding electrodes 222 to protect and beautify an appearance of a finished product of the shielding film 2.

Figure 12:
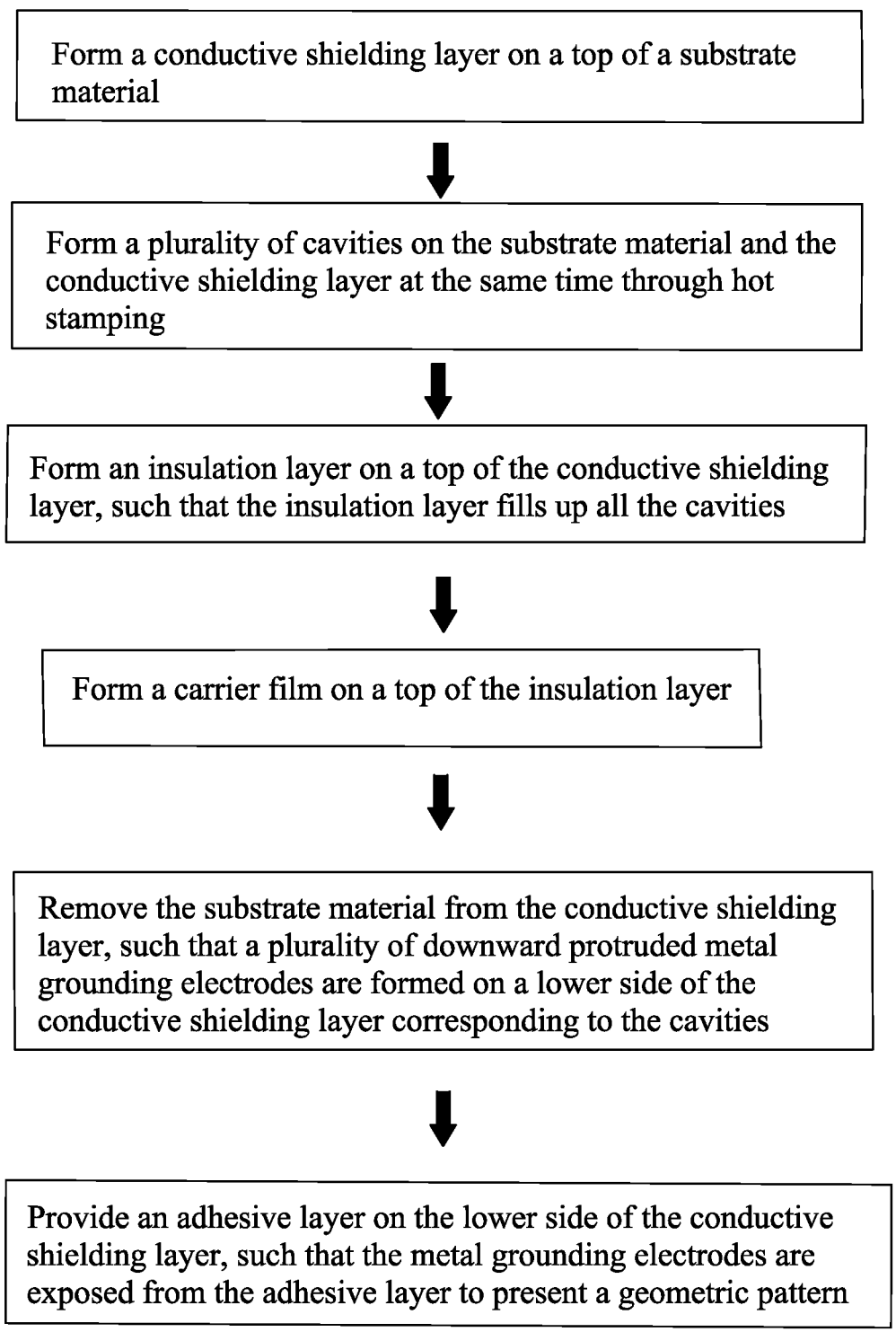
FIG. 12 is a flowchart showing the steps included in a second embodiment of the shielding film manufacturing method according to the present invention.
Figure 13:
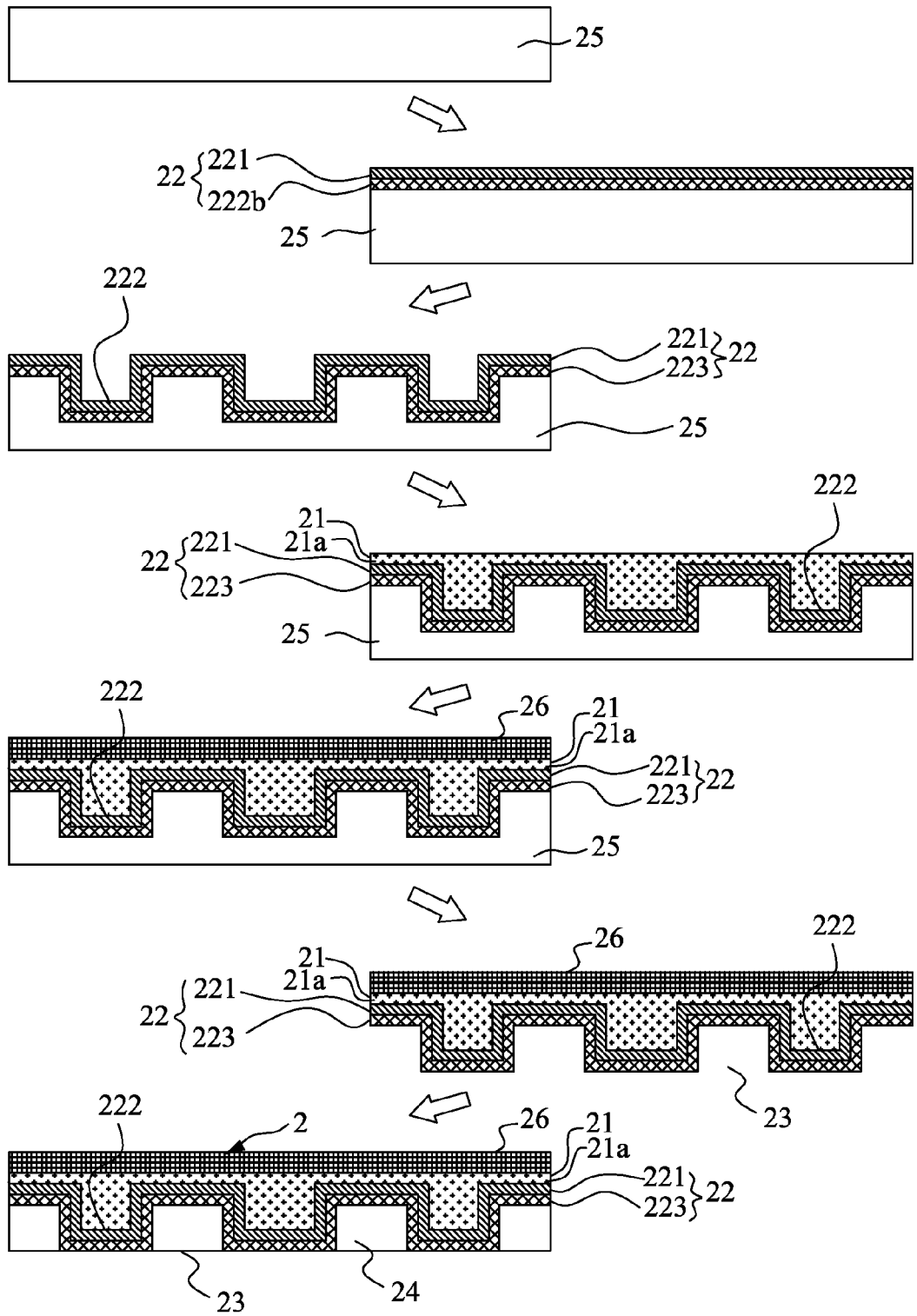
FIG. 13 is a pictorial description of the steps shown in FIG. 12.

Please refer to FIG. 12 that is a flowchart showing the steps included in a second embodiment of the shielding film manufacturing method of the present invention, and to FIG. 13 that is a pictorial description of the steps in the flowchart of FIG. 12. Since the second embodiment of the method of the present invention is different from the first embodiment only in the step (A) while all other steps thereof from (B) to (E) are the same as those in the first embodiment, only the step (A) is described in detail herein. Step (A): Provide a substrate material 25, and form a conductive shielding layer 22 on a top of the substrate material 25 through vapor deposition, sputtering deposition or chemical deposition, so that the substrate material and the conductive shielding layer 22 are connected to each other. Then, form a plurality of cavities on the connected substrate material 25 and conductive shielding layer 22 through hot stamping on an embossing machine, such that the substrate material 25 and the conductive shielding layer 22 correspondingly form a cavity-showing pattern having a plurality of cavities.

Figure 14:
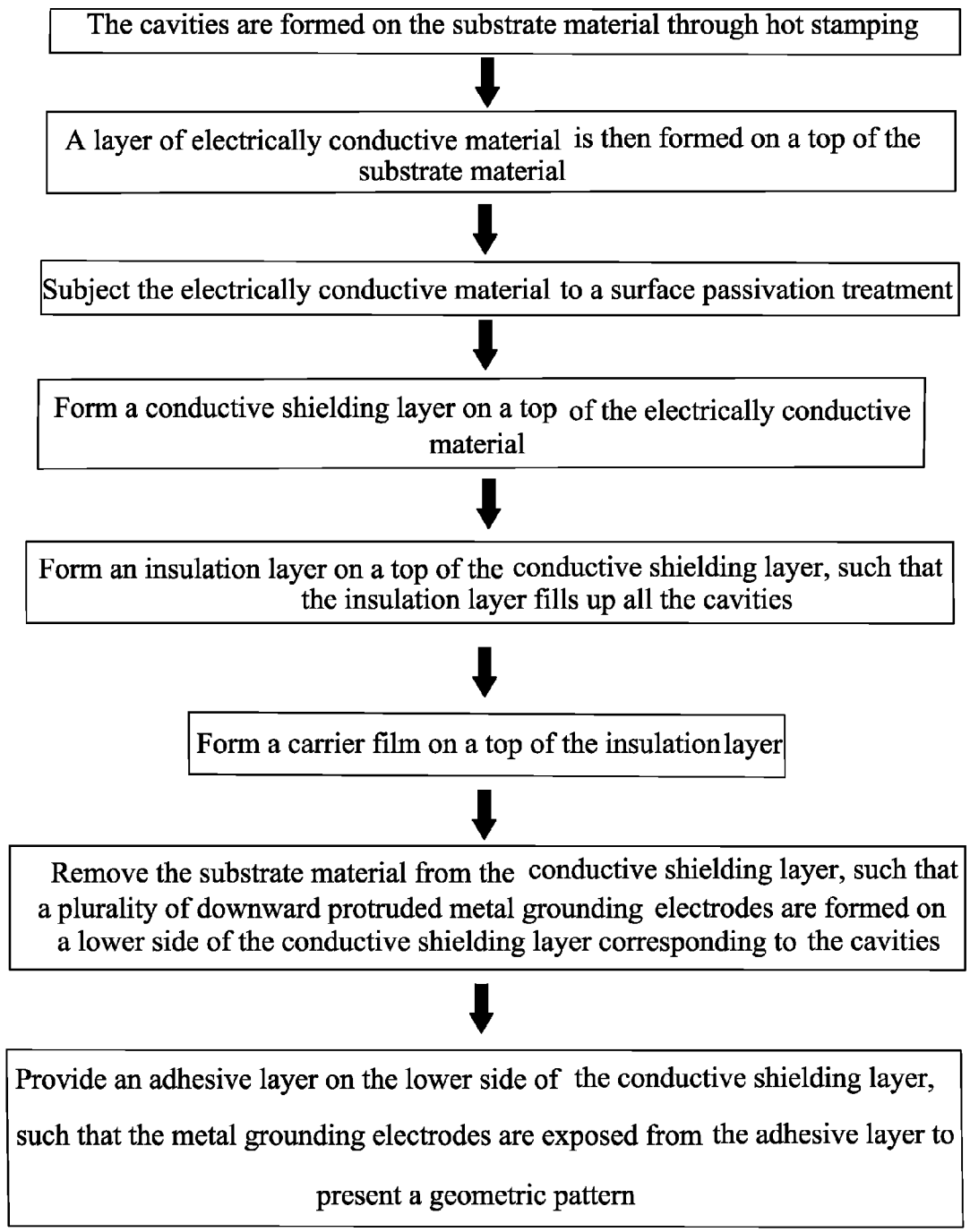
FIG. 14 is a flowchart showing the steps included in a third embodiment of the shielding film manufacturing method according to the present invention.
Figure 15:
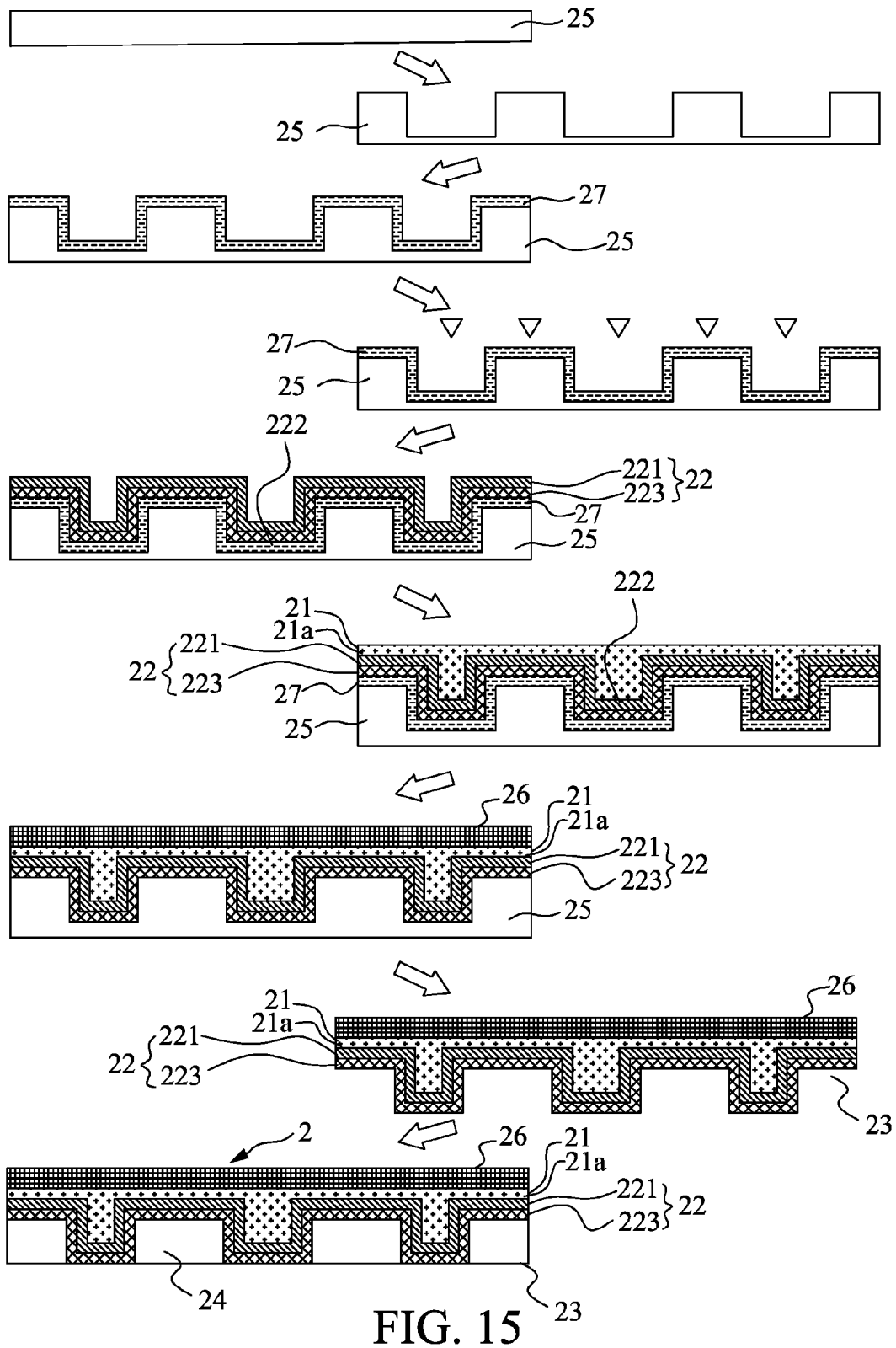
FIG. 15 is a pictorial description of the steps shown in FIG. 14.

Please refer to FIG. 14 that is a flowchart showing the steps included in a third embodiment of the shielding film manufacturing method of the present invention, and to FIG. 15 that is a pictorial description of the steps in the flowchart of FIG. 14. Since the third embodiment of the method of the present invention is different from the second embodiment only in the step (A), only the step (A) is described in detail herein. Step (A): Form a cavity-showing pattern directly on a substrate material 25 through hot stamping on an embossing machine, wherein the substrate material is a repeatedly usable master template; and then, form a layer of electrically conductive material 27 on a top of the substrate material 25 through vapor deposition, sputtering deposition or chemical deposition. The electrically conductive material 27 is a metal material. Thereafter, subject the electrically conductive material 27 to a surface passivation treatment for changing the surface state of the metal material to a corrosion-resistant passive state. At this point, a thin film, i.e. a passivation film, is formed on the surface of the metal material. In industrial applications, a passivating agent, mainly an oxidizing agent, is usually used in the metal passivation treatment to form a layer of protection film on the metal surface. For instance, cold concentrated sulfuric acid and cold concentrated nitric acid can be used in the passivation treatment for iron and aluminum. According to the present invention, through the passivation treatment, the electrically conductive material 27 can be easily separated from the layer with which the electrically conductive material 27 is in contact and the substrate material 25 can have increased durability.

Finally, also in the step (A), form a conductive shielding layer 22 on a top of the electrically conductive material 27 through sputtering deposition, chemical deposition or electroplating. Among others, electroplating process is a high-efficiency and high-precision forming technique. By utilizing the principle of electroplating deposition and externally supplied electric energy, a mixed solution containing metal ions and other additives is caused to react with a cathode or an anode, so that electrochemical oxidation and reduction reactions take place at the anode and the cathode, respectively, to deposit desired metal on the surface of a given object. Since all other steps (B) to (E) of the third embodiment are the same as those in the first and second embodiments, they are not repeatedly described herein.

Figure 16:
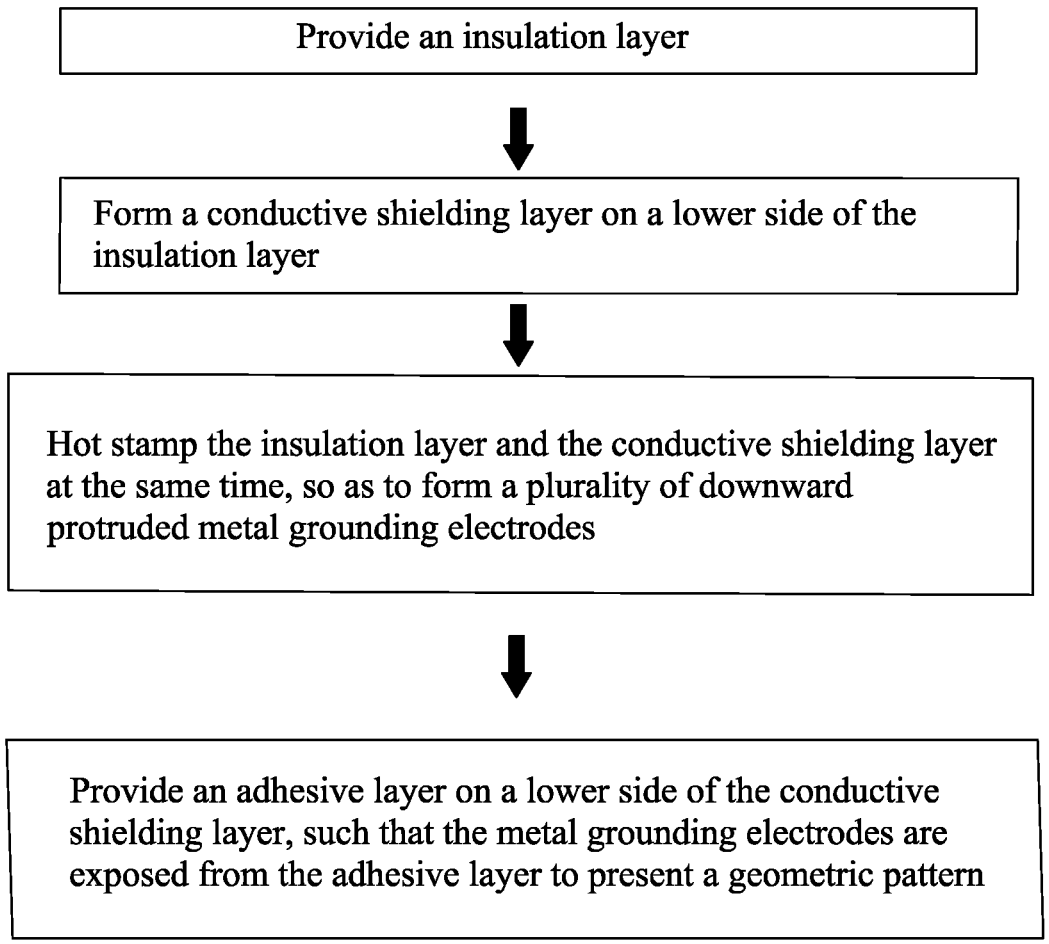
FIG. 16 is a flowchart showing the steps included in a fourth embodiment of the shielding film manufacturing method according to the present invention.
Figure 17:
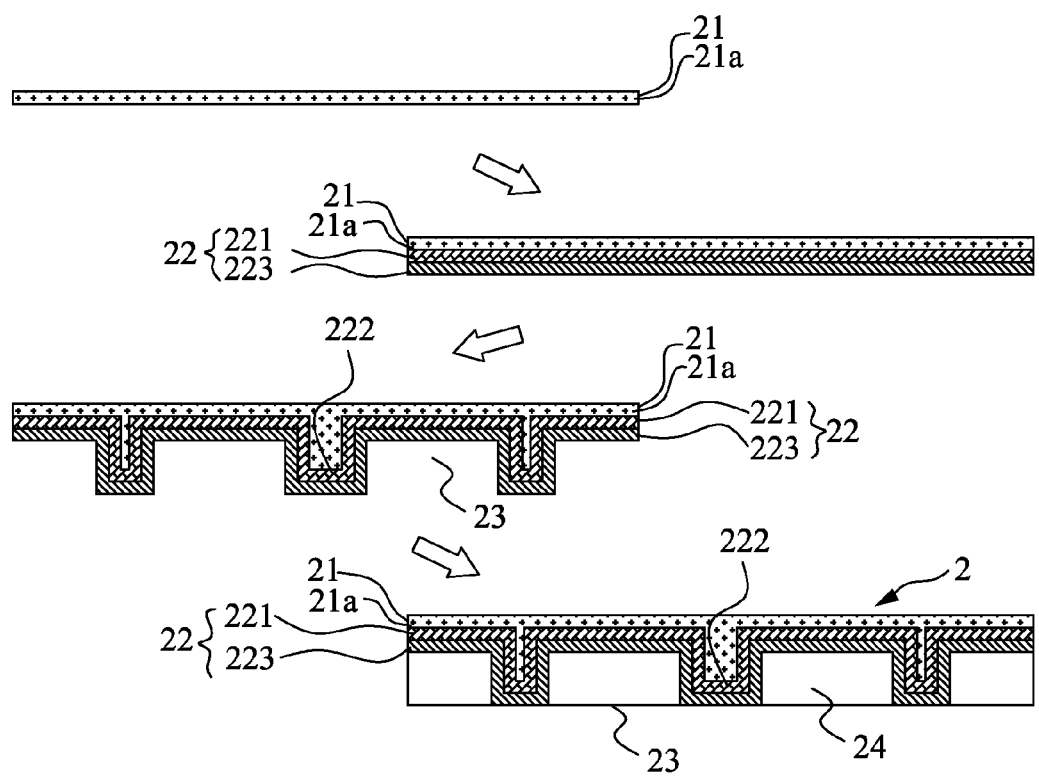
FIG. 17 is a pictorial description of the steps shown in FIG. 16.

FIG. 16 is a flowchart showing the steps included in a fourth embodiment of the shielding film manufacturing method of the present invention, and FIG. 17 is a pictorial description of the steps in the flowchart of FIG. 16. The following is a detailed description of these steps, which are numbered from (A) to (D) herein for ease of reference. Step (A): provide an insulation layer 21; step (B): form a conductive shielding layer 22 on a lower side of the insulation layer 21 through vapor deposition, sputtering deposition or chemical deposition; step (C): subject the insulation layer 21 and the conductive shielding layer 22 to a hot stamping process on an embossing machine at the same time, so that they together form a plurality of downward protruded metal grounding electrodes 222; and step (D): fill an adhesive layer 24 in filling spaces 23 formed on a lower side of the conductive shielding layer 22 among the metal grounding electrodes 222, such that the metal grounding electrodes 222 are exposed from the adhesive layer 24 to present a geometric pattern.

Figure 18:
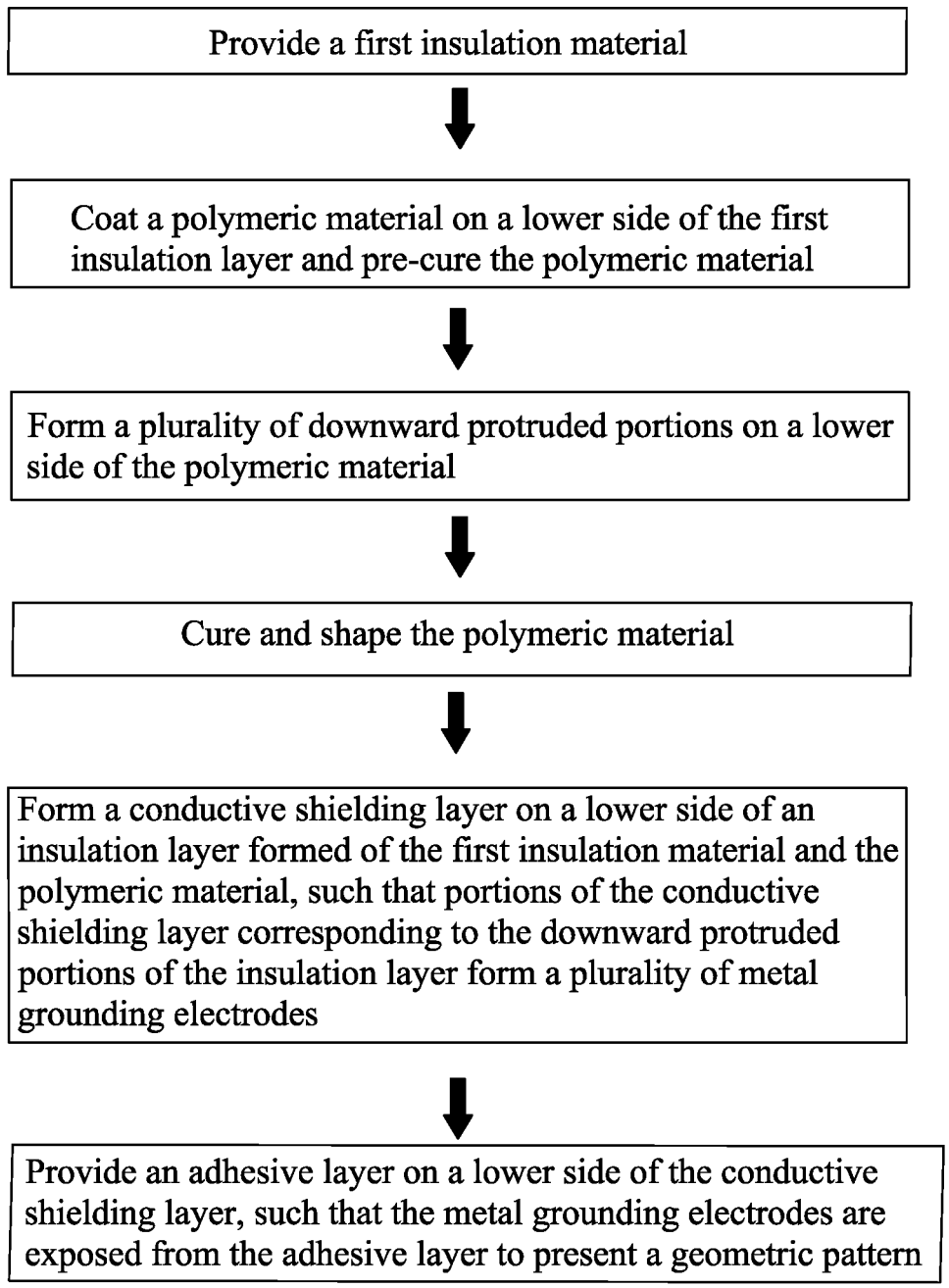
FIG. 18 is a flowchart showing the steps included in a fifth embodiment of the shielding film manufacturing method according to the present invention.
Figure 19:
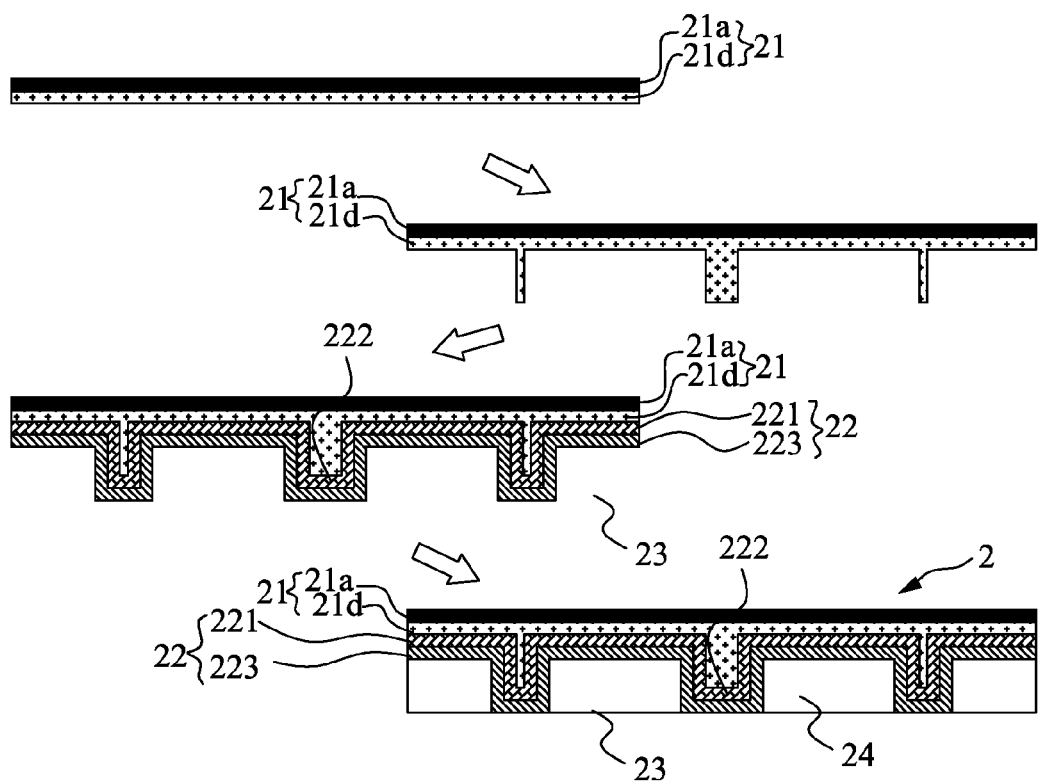
FIG. 19 is a pictorial description of the steps shown in FIG. 18.

FIG. 18 is a flowchart showing the steps included in a fifth embodiment of the shielding film manufacturing method of the present invention, and FIG. 19 is a pictorial description of the steps in the flowchart of FIG. 18. The following is a detailed description of these steps, which are numbered from (A) to (C) herein for ease of reference.

Step (A): Provide a first insulation material 21a; coat a polymeric material 21d on a lower side of the first insulation layer 21a using a coating machine and pre-cure the polymeric material 21d; form a pattern on a lower side of the polymeric material 21d through hot stamping, so that the first insulation material 21a and the patterned polymeric material 21d together constitute an insulation layer 21; form a plurality of downward protruded portions on the insulation layer 21 corresponding to the pattern formed on the polymeric material 21d; and irradiate ultraviolet (UV) light to the polymeric material 21d or heat-dry the polymeric material 21d in an oven for the polymeric material 21d to fully cure and be shaped.

Step (B): Form a conductive shielding layer 22 on a lower side of the insulation layer 21, such that portions of the conductive shielding layer 22 corresponding to the downward protruded portions of the insulation layer 21 form a plurality of metal grounding electrodes 222.

Step (C): Provide an adhesive layer 24 on a lower side of the conductive shielding layer 22 with the metal grounding electrodes 222 exposed from the adhesive layer 24 to present a geometric pattern.

Figure 20:
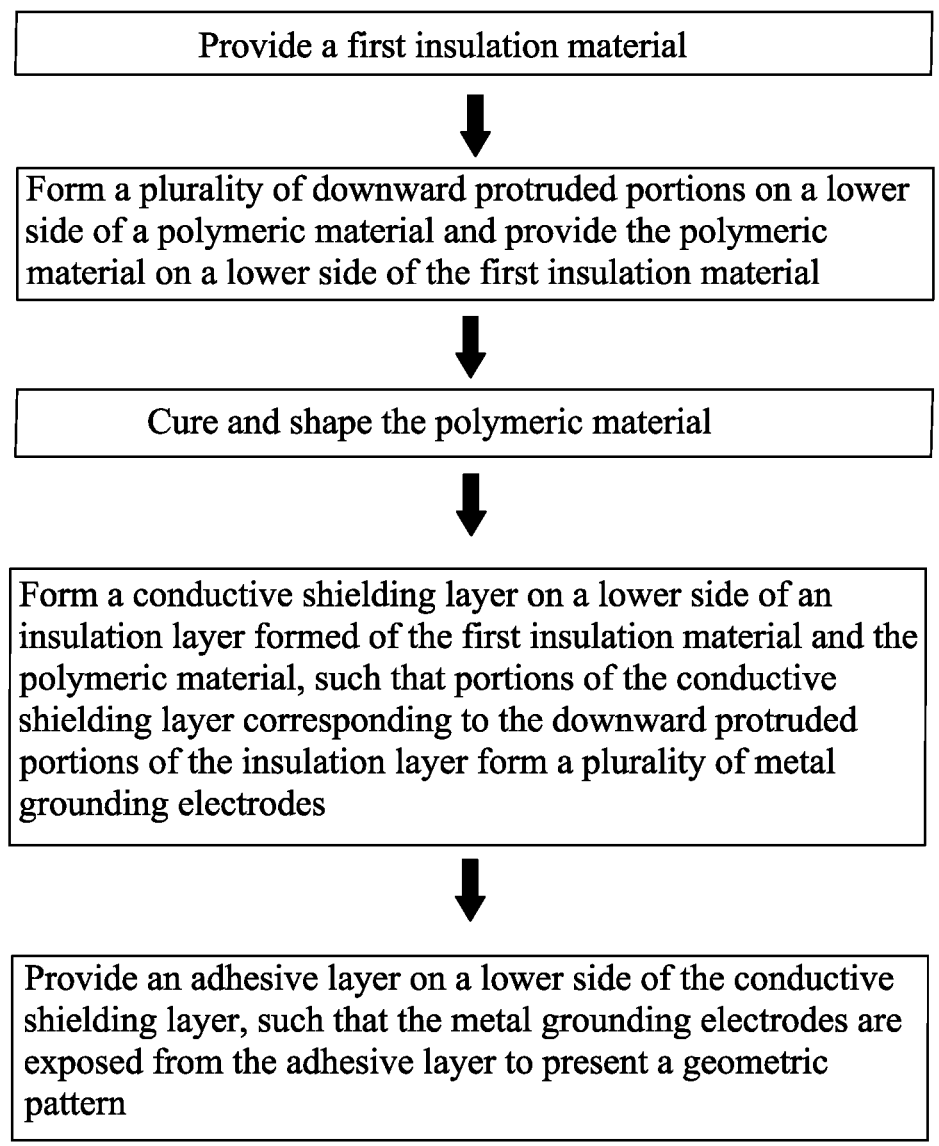
FIG. 20 is a flowchart showing the steps included in a sixth embodiment of the shielding film manufacturing method according to the present invention.
Figure 21:
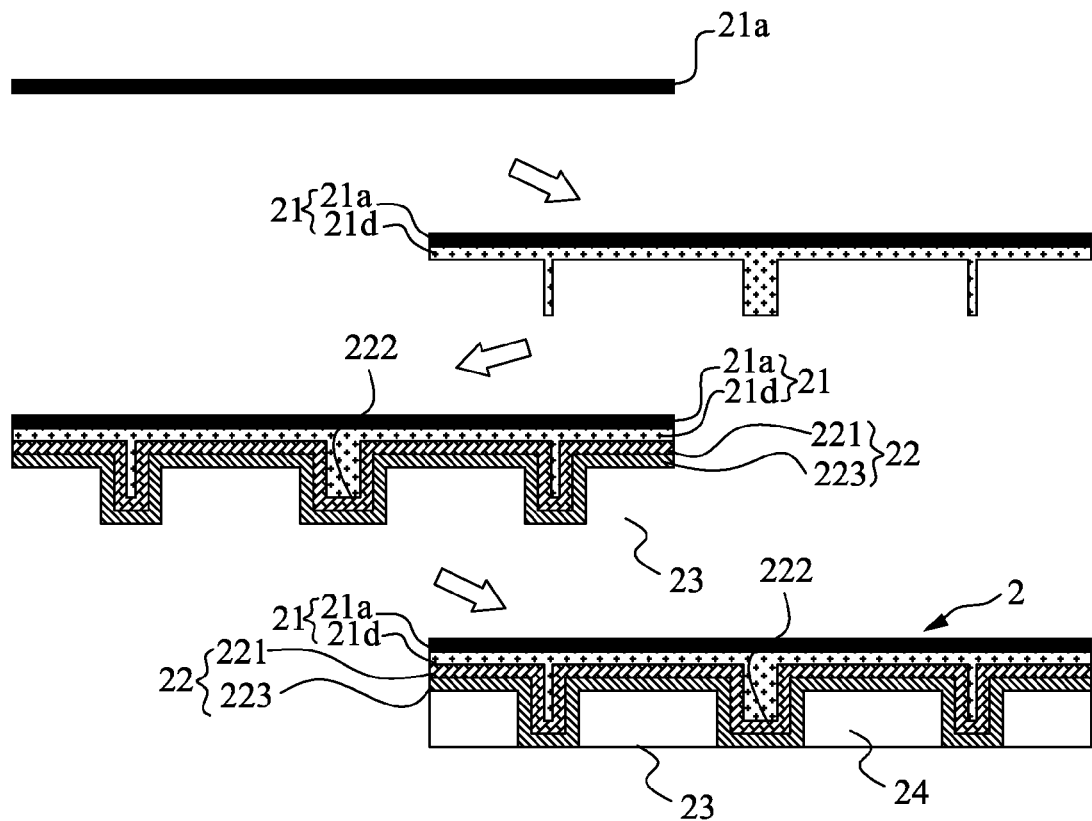
FIG. 21 is a pictorial description of the steps shown in FIG. 20.

FIG. 20 is a flowchart showing the steps included in a sixth embodiment of the shielding film manufacturing method of the present invention, and FIG. 21 is a pictorial description of the steps in the flowchart of FIG. 20. These steps are numbered from (A) to (C) herein for ease of reference. Step (A): Provide a first insulation material 21a; form a pattern on a polymeric material 21d through transfer printing or screen printing and provide the patterned polymeric material 21d on a lower side of the first insulation material 21a, so that the first insulation material 21a and the patterned polymeric material 21d together constitute an insulation layer 21; form a plurality of downward protruded portions on a lower side of the insulation layer 21; and irradiate ultraviolet (UV) light to the polymeric material 21d or heat-dry the polymeric material 21d in an oven for the polymeric material 21d to fully cure and be shaped.

Since the steps (B) and (C) in the sixth embodiment are similar to those in the fifth embodiment, they are not repeatedly described herein.

Figure 23:
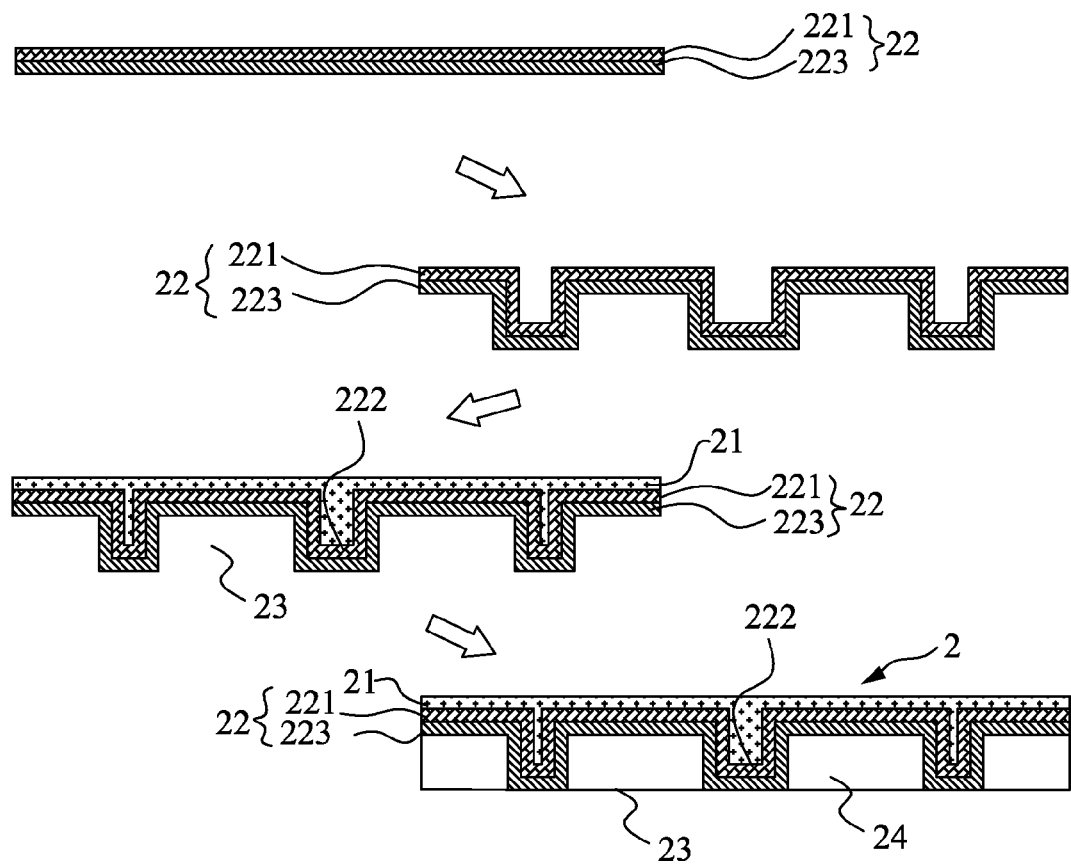
FIG. 23 is a pictorial description of the steps shown in FIG. 22.
Figure 24:
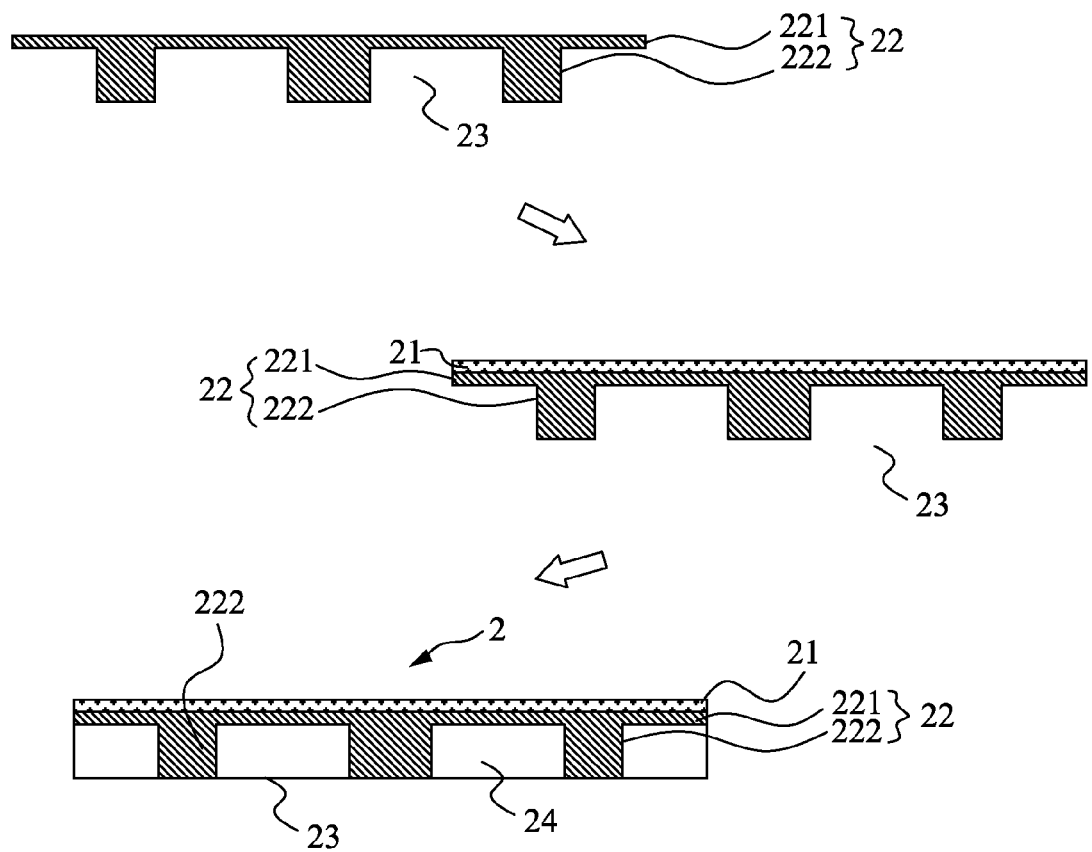
FIG. 24 is a pictorial description of the steps included in a variant of the seventh embodiment of the shielding film manufacturing method according to the present invention.

FIG. 22 is a flowchart showing the steps included in a seventh embodiment of the shielding film manufacturing method of the present invention, and FIGS. 23 and 24 are a pictorial description of the steps in the flowchart of FIG. 21. The following is a detailed description of these steps, which are numbered from (A) to (C) herein for ease of reference.

Step (A): Form a conductive shielding layer 22 through calendering or electroplating, and form a plurality of downward protruded portions on the conductive shielding layer 22, so that the downward protruded portions respectively form a metal grounding electrode 222.

Step (B): Form an insulation layer 21 on a top of the conductive shielding layer 22.

Step (C): Provide an adhesive layer 24 on a lower side of the conductive shielding layer 22 opposite to the insulation layer 21, while the metal grounding electrodes 222 are exposed from the adhesive layer 24 to present a geometric pattern.

In the seventh embodiment, the conductive shielding layer 22 provided in the step (A) can be subjected to a hot stamping process on an embossing machine to form the plurality of downward protruded portions, as shown in FIG. 23.

According to a variant of the seventh embodiment, the conductive shielding layer 22 provided in the step (A) can be shaped in a mold having a plurality of cavities, so as to form a plurality of downward protruded portions on a lower side thereof, as shown in FIG. 24.

Since the above variant is different from the seventh embodiment only in the step (A) for forming the conductive shielding layer 22, the steps (B) and (C) for the variant similar to those in the seventh embodiment are not repeatedly described herein. Further, in the variant of the seventh embodiment shown in FIG. 24, there is not any weatherproof layer 223 formed on the conductive shielding layer 22. However, according to another operable embodiment, although not shown in the drawings, a weatherproof layer 223 can be formed on outer surfaces of the metal grounding electrodes 222 through electroplating.

In all the first to the seventh embodiment of the method of the present invention, the insulation layer 21 can be a simple structure formed of a first insulation material 21a or a composite structure formed of the first insulation material 21a and a bonding material 21b located on a lower side of the first insulation material 21a; and the weatherproof layer 223 of the conductive shielding layer 22 can be formed according to actual requirement in use. In an operable embodiment, only a single weatherproof layer 223 is formed on the surfaces of the metal grounding electrodes 222, as shown in FIGS. 2C, 3C and 4C. In another operable embodiment, additional weatherproof layers 223 can be further formed on the upper side and the lower side of the metal shielding material 221 of the conductive shielding layer 22 through sputtering deposition, electroplating or chemical deposition, as shown in FIGS. 2D, 3D and 4D. And, in the method of manufacturing the shielding film 2, a further step can be included after other steps to provide a release material 3 on the surfaces of the adhesive layer 24 and the metal grounding electrodes 222 (see FIG. 11), so as to protect and beautify the appearance of a finished product of the shielding film 2.

The following table compares the structure of the shielding film 2 manufactured in the method of the present invention (Exp 1-6) with the structure of the conventional shielding film 1 shown in FIG. 1 (Comp 1-2). And, as can be seen from the table, the shielding film 2 of the present invention is superior to the conventional shielding film 1 in terms of grounding effect and bonding strength.

|  | Exp* 1 | Exp 2 | Exp 3 | Exp 4 | Exp 5 | Exp 6 | Comp* 1 | Comp 2 |
|---|---|---|---|---|---|---|---|---|
| First insulation material (μm) | — | — | 5 | 5 | 15 | 15 | 10 | 10 |
| Insulation layer (μm) | 12.5 | 12.5 | 12.5 | 12.5 | 12.5- | — | — | — |
| Bonding material (μm) | 0.01 | 0.01 | 0.01 | 0.01 | 0.01 | 0.01 | — | — |
| Metal shielding material (μm) | 1 | 0.5 | — | — | — | — | 1 | 1 |
| Metal grounding electrodes (μm) | 8 | 8 | 5.5 | 10.5 | 10 | 10 | — | — |
| Shape of metal grounding electrodes | Square grid | Square grid | Round post | Round post | Hex grid | Hex grid | — | — |
| Percent of bonding area (%) | 92.16 | 92.16 | 85 | 85 | 89.9 | 89.9 | | |
| Weather-proof layer (μm) | 0.01 | 0.01 | 0.01 | 0.01 | 0.01 | 0.02 | | |
| Adhesive layer (μm) | 8 | 8 | 5 | 10 | 8.5 | 8.5 | | |
| Conductive adhesive (μm) | — | — | — | — | — | — | 10 | 10 |
| Content of conductive particles (%) | — | — | — | — | — | — | 50 | 70 |
| Electro-magnetic shielding effectiveness (dB) | 61 | 59 | 63 | 65 | 65 | 66 | 52 | 54 |
| Contact resistance (mΩ) | 210 | 257 | 121 | 149 | 163 | 178 | 571 | 362 |
| Peel strength (N/cm) | 7.2 | 7.1 | 6.2 | 5.9 | 6.8 | 6.3 | 4.9 | 4.1 |
| Weather resistance (mΩ) | 275 | 313 | 143 | 171 | 197 | 195 | 1211 | 984 |
| Variation in weather resistance (%) | 131 | 122 | 118 | 115 | 121 | 110 | 212 | 272 |

*Exp is an abbreviation of Experiment; and Comp is an abbreviation of Comparison.

In summary, by forming the conductive shielding layer and the metal grounding electrodes and by filling the adhesive layer in the large area of filling spaces defined among the metal grounding electrodes, the shielding film of the present invention avoids the problems of the conventional shielding film as having high contact resistance among the conductive particles added to the conductive adhesive layer. Therefore, the shielding film of the present invention has good electrical conduction property and accordingly, provides enhanced electromagnetic shielding effect.

The present invention has been described with some preferred embodiments thereof and it is understood that many changes and modifications in the described embodiments can be carried out without departing from the scope and the spirit of the invention that is intended to be limited only by the appended claims.

What is claimed is:
1. A shielding film, comprising:
  an insulation layer;
  a conductive shielding layer being formed on a lower side of the insulation layer and having a part area downward protruded to form a plurality of metal grounding electrodes; and the metal grounding electrodes being distributed over a lower side of the conductive shielding layer and together presenting a geometric pattern to define a plurality of relatively large filling spaces among the metal grounding electrodes; and
  an adhesive layer being filled in the filling spaces.

2. The shielding film as claimed in claim 1, wherein the insulation layer is selected from the group consisting of a simple structure and a composite structure; the simple structure being formed of a first insulation material, and the composite structure being formed of the first insulation material and a bonding material.

3. The shielding film as claimed in claim 2, wherein the bonding material is selected from the group consisting of nickel (Ni), tin (Sn), zinc (Zn), silver (Ag), copper (Cu), aluminum (Al), titanium (Ti), chromium (Cr), molybdenum (Mo), tungsten (W), iron (Fe), vanadium (V), cobalt (Co), niobium (Nb), a polymeric material, any combination of the aforesaid materials, and any oxide of the aforesaid materials.

4. The shielding film as claimed in claim 1, wherein the conductive shielding layer further includes at least one weatherproof layer.

5. The shielding film as claimed in claim 1, wherein the insulation layer contains particles of at least one type of electrically insulating, heat conductive material, and the adhesive layer contains metal particles.

6. The shielding film as claimed in claim 1, wherein the conductive shielding layer includes at least one metal shielding material located below and connected to the insulation layer, and the metal grounding electrodes being provided on a lower side of the metal shielding material.

7. The shielding film as claimed in claim 6, wherein the metal shielding material has a thickness ranged between 0.1 μm and 15 μm.

8. The shielding film as claimed in claim 6, wherein the metal shielding material is selected from the group consisting of copper (Cu), silver (Ag), aluminum (Al), nickel (Ni), zinc (Zn), tin (Sn), iron (Fe), carbon (C), graphite, graphene, an electrically conductive polymeric material, and any combination thereof.

9. The shielding film as claimed in claim 6, wherein the metal grounding electrodes respectively have a height ranged between 3 μm and 30 μm.

10. The shielding film as claimed in claim 6, wherein the metal grounding electrodes are formed of a material selected from the group consisting of copper (Cu), silver (Ag), aluminum (Al), nickel (Ni), zinc (Zn), tin (Sn), iron (Fe), carbon (C), graphite, graphene, and any combination thereof.

11. The shielding film as claimed in claim 6, wherein the conductive shielding layer further includes at least one second insulation material, which is located between and connected to two adjacent layers of the metal shielding material.

12. The shielding film as claimed in claim 1, wherein the conductive shielding layer includes at least one metal shielding material located below and connected to the insulation layer, and the metal grounding electrodes being downward protruded from a lower side of the metal shielding material.

13. The shielding film as claimed in claim 1, wherein the insulation layer includes a plurality of first protruded portions formed on a lower side thereof, and the conductive shielding layer includes at least one metal shielding material located below and connected to the insulation layer; and portions of the metal shielding layer corresponding to the first protruded portions of the insulation layer forming the metal grounding electrodes.

14. A shielding film, comprising:
a conductive shielding layer, a part area of which being downward protruded to form a plurality of metal grounding electrodes; and the metal grounding electrodes being distributed over a lower side of the conductive shielding layer and together presenting a geometric pattern to define a plurality of relatively large filling spaces among the metal grounding electrodes; and
an adhesive layer being filled in the filling spaces.

15. A method of manufacturing shielding film, comprising the following steps:
(A) connecting a conductive shielding layer to a top of a substrate material, and forming a plurality of cavities on the substrate material and the conductive shielding layer;
(B) forming an insulation layer on a top of the conductive shielding layer, such that the insulation layer fills up all the cavities;
(C) forming a carrier film on a top of the insulation layer;
(D) removing the substrate material from the conductive shielding layer, such that a plurality of downward protruded metal grounding electrodes are formed on a lower side of the conductive shielding layer corresponding to the cavities; and
(E) providing an adhesive layer on the lower side of the conductive shielding layer, such that the metal grounding electrodes distributed over the lower side of the conductive shielding layer are exposed from the adhesive layer to present a geometric pattern.

16. The method as claimed in claim 15, wherein in the step (A), the cavities are formed on the substrate material through hot stamping; and the conductive shielding layer is then formed on a top of the substrate material and the cavities.

17. The method as claimed in claim 15, wherein in the step (A), the conductive shielding layer is formed on a top of the substrate material; and then, the substrate material and the conductive shielding layer are hot stamped at the same time to form the cavities.

18. The method as claimed in claim 15, wherein in the step (A), the cavities are formed on the substrate material through hot stamping; a layer of electrically conductive material is then formed on a top of the substrate material and subjected to a surface passivation treatment; and the conductive shielding layer is formed on a top of the electrically conductive material.

* * * * *